US010620238B2

(12) United States Patent
Hines et al.

(10) Patent No.: US 10,620,238 B2
(45) Date of Patent: Apr. 14, 2020

(54) REMOTELY POWERED LINE MONITOR

(71) Applicant: SENSANNA INCORPORATED

(72) Inventors: Jacqueline H. Hines, Annapolis, MD (US); Andrew T. Hines, Annapolis, MD (US); Doug Kirkpatrick, San Francisco, CA (US)

(73) Assignee: SENSANNA INCORPORATED, Hanover, MD (US)

( * ) Notice: Subject to any disclaimer, the term of this patent is extended or adjusted under 35 U.S.C. 154(b) by 244 days.

(21) Appl. No.: 15/298,725

(22) Filed: Oct. 20, 2016

(65) Prior Publication Data

US 2018/0113161 A1 Apr. 26, 2018

(51) Int. Cl.
*G01R 29/08* (2006.01)
*G01R 15/14* (2006.01)

(52) U.S. Cl.
CPC ......... *G01R 15/144* (2013.01); *G01R 15/148* (2013.01); *G01R 29/0878* (2013.01)

(58) Field of Classification Search
CPC ........ G01R 29/08; G01R 15/16; G01R 15/06; G01R 15/181; G01R 15/142; G01R 15/146; G01R 15/202; G01R 15/247; G01R 19/0084; G01R 19/0023; G01R 19/0046; G01R 19/0092; G01R 19/155; G01R 1/06; G01R 1/22
See application file for complete search history.

(56) References Cited

U.S. PATENT DOCUMENTS

| | | | | | |
|---|---|---|---|---|---|
| 4,052,665 | A | * | 10/1977 | Gruenwald | F02P 17/12 324/126 |
| 4,158,810 | A | * | 6/1979 | Leskovar | G01R 15/26 324/127 |
| 4,510,443 | A | * | 4/1985 | Inaba | G01R 15/26 324/120 |

(Continued)

FOREIGN PATENT DOCUMENTS

JP 01272209 A * 10/1989

OTHER PUBLICATIONS

English Machine Translation of Kato JP 01272209A.*

*Primary Examiner* — Lee E Rodak
(74) *Attorney, Agent, or Firm* — Nixon Peabody LLP; Jeffrey L. Costellia

(57) ABSTRACT

Improved devices, apparatuses, systems, and methods involving the use of field probes with voltage-controlled variable impedance elements and surface-launched acoustic wave devices, including surface acoustic wave (SAW) devices and SAW sensor-tag wireless interface devices to measure voltage and current in current carrying conductors (CCCs) via measurement of the electric fields and magnetic fields around said CCCs are disclosed. The devices, apparatuses, systems, and methods taught in the present invention include a remotely powered line-mounted measurement unit that requires no connection to electrical ground for operation, and that has no internal energy source, no energy harvesting or power conditioning circuitry, no discrete energy storage components, and no radio. The devices, apparatuses, systems, and methods taught in the present invention also provide for determining the phase (leading or lagging) of the current relative to the voltage in AC power systems, and also provide for measurement of temperature of the conductor.

19 Claims, 29 Drawing Sheets

(56) References Cited

U.S. PATENT DOCUMENTS

| | | | | |
|---|---|---|---|---|
| 4,963,819 A | * | 10/1990 | Clarke | G01R 15/16 |
| | | | | 174/73.1 |
| 5,473,244 A | * | 12/1995 | Libove | G01R 1/22 |
| | | | | 324/126 |
| 6,104,181 A | * | 8/2000 | Muller | G01R 15/26 |
| | | | | 324/126 |
| 8,269,490 B2 | * | 9/2012 | Koyilothu | B82Y 25/00 |
| | | | | 310/313 R |
| 2002/0130587 A1 | * | 9/2002 | Shlimak | G06K 19/0675 |
| | | | | 310/313 R |
| 2002/0167303 A1 | * | 11/2002 | Nakano | G01R 15/16 |
| | | | | 324/126 |
| 2002/0171433 A1 | * | 11/2002 | Watanabe | G01R 15/16 |
| | | | | 324/539 |
| 2006/0192002 A1 | * | 8/2006 | Forster | G06K 7/0008 |
| | | | | 235/385 |
| 2007/0086130 A1 | * | 4/2007 | Sorensen | G01R 15/16 |
| | | | | 361/62 |
| 2011/0148393 A1 | * | 6/2011 | de Buda | G01R 15/06 |
| | | | | 324/76.11 |
| 2012/0197558 A1 | * | 8/2012 | Henig | G01K 11/265 |
| | | | | 702/58 |
| 2013/0099773 A1 | * | 4/2013 | Wildermuth | G01R 15/242 |
| | | | | 324/96 |
| 2016/0329703 A1 | * | 11/2016 | Chawgo | H02H 3/05 |
| 2017/0030946 A1 | * | 2/2017 | Gravermann | G01R 15/16 |

* cited by examiner

REMOTELY POWERED LINE MONITOR

STATEMENT REGARDING FEDERALLY SPONSORED RESEARCH OR DEVELOPMENT

This invention was made with government support under contract DE-EE0007195 awarded by the Department of Energy (DOE). The government has certain rights in the invention.

BACKGROUND OF THE INVENTION

Field of the Invention

The field of the present invention relates to devices, apparatuses, systems, and methods used to measure the voltage, current, temperature, and other properties of current carrying conductors (CCCs). More specifically, the present invention relates to the use of field probes with voltage-controlled variable impedance elements and surface-launched acoustic wave devices, including surface acoustic wave (SAW) sensor-tag wireless interface devices, to measure voltage and current in current CCCs via measurement of the electric fields and magnetic fields around said CCCs. The devices, apparatuses, systems, and methods taught in the present invention include a remotely powered line-mounted measurement unit that requires no connection to electrical ground for operation, and also provide for determining the phase (leading or lagging) of the current relative to the voltage in AC power systems, thereby providing the information necessary to determine power factor. Such information is useful, for example, in monitoring the condition of the power distribution grid.

Description of Related Art

Acoustic Wave Sensors: Sensors based on surface-launched acoustic wave (known as surface acoustic wave or SAW) devices have been developed since the 1980's for application to physical measurements (temperature, pressure, torque, strain, etc.) and to a wide range of chemical and biological detection problems. These widely varying devices have been described in detail in the open literature, including the following: U.S. Pat. No. 7,268,662, entitled Passive SAW-based hydrogen sensor and system, U.S. Pat. No. 7,434,989, entitled SAW temperature sensor and system, U.S. Pat. No. 7,500,379, entitled Acoustic wave array chemical and biological sensor U.S. Pat. No. 7,791,249, entitled Frequency coded sensors incorporating tapers, U.S. Pat. No. 8,094,008, entitled Coded acoustic wave sensors using time diversity, U.S. Pat. No. 8,441,168, entitled SAW Sensor tags with enhanced performance, U.S. Pat. No. 9,121,754, entitled Surface Acoustic Wave Deposition Monitor for Ultra-Thin Films, U.S. Utility application Ser. No. 13/679,607 (US20130130362A1), entitled Power Spectral Density Chemical and Biological Sensor, and U.S. Utility application Ser. No. 13/694,889 (US20130181573A1), entitled Individually Identifiable Surface Acoustic Wave Sensors, Tags, and Systems.

Acoustic Wave Sensor Interrogation Systems: Acoustic wave sensor devices have been operated within a wide range of wired and wireless interrogation system architectures, which have generally been designed specifically to operate with the selected sensor(s). The system architecture is usually selected based on specific device characteristics and application requirements, and generally involves absolute or differential measurements of sensor frequency, phase, delay, amplitude, or power spectral density, and changes in these quantities with exposure to changes in target parameters, to provide the output sensor measurement. Conventional wireless interrogation system architectures include pulsed radar-like delay measurement systems, Fourier transform based measurement systems, delay line and resonator-based oscillator systems, and time-integrating correlator based interrogation systems. Radio architectures include conventional homodyne and heterodyne mix-down systems, and direct (to baseband or to near-baseband) conversion systems. Software defined radio implementations of selected interrogation systems can be advantageous, in terms of flexibility and performance.

SAW Sensor-tags: SAW devices have been used as wireless interface devices to external voltage producing or impedance varying sensors, as discussed in U.S. Pat. No. 8,441,168, entitled SAW Sensor tags with enhanced performance. SAW sensor-tag interface devices enable the wireless reading of (batteryless or passive) sensors that normally are operated in powered, wired systems. SAW wireless interface devices, which can be individually identifiable, or RFID-enabled, are referred to as SAW sensor-tags or SAW sensor-tag wireless interface devices. Brocato, in "Passive Wireless Sensor Tags," Sandia Report SAND2006-1288, Sandia National Laboratories, Albuquerque, N. Mex. 87185, March 2006, demonstrated that a SAW differential delay line could be used, with a sensor that changes impedance with measured quantity attached electrically in parallel with a reflector in one of the paths, to measure variations in the attached sensor. Other researchers have also demonstrated similar devices, including those described by Reindl et al. in "Theory and Application of Passive SAW Radio Transponders as Sensors," *IEEE Transactions on Ultrasonics, Ferroelectrics, and Frequency Control*, Vol. 45, No. 5, September 1998, pp. 1281-1292; Scholl et al. in "Wireless Passive SAW Sensor Systems for Industrial and Domestic Applications," *Proceedings of the* 1998 *IEEE International Frequency Control Symposium*, p. 595-601; and Schimetta et al. in "A Wireless Pressure-Measurement System Using a SAW Hybrid Sensor," *IEEE Transactions on Microwave Theory and Technique*, Vol. 48, No. 12, December 2000, pp. 2730-2733.

More recently, a range of RFID enabled, dispersive, half-dispersive, and non-dispersive SAW wireless interface devices have been demonstrated that can be used to read a wide range of external sensors and devices, including switches, RTDs, thermistors, strain gauges, and acoustic emission sensors. Methods have been shown for adapting SAW sensors to operate with external sensors with impedances (Z) having real parts Re(Z) varying from low (~20Ω) resistance to moderately high (over 5 kΩ) resistance, the latter being devices that normally would not interface well with SAW devices. This work is described in the final report for NASA SBIR Phase I contract NNX09CE49P (Jul. 22, 2009). For voltage generating external sensors (such as AE sensors, thermocouples, etc.), the external sensor voltage was applied as the gate voltage on a zero-bias (normally ON) field effect transistor (FET).

Wireless measurement of current and voltage: SAW devices measured in wired systems were shown in the early 1970's to be capable of measuring voltages directly, through the change in acoustic wave velocity produced by voltages applied transverse to the SAW die. However, the voltages required to produce significant changes in frequency or delay were large (hundreds of volts to kV) for realistic die thicknesses. More recent work has shown that SAW devices can be used with zero-bias (normally ON) field effect transistors (FETs) to produce wireless devices capable of reading voltages generated by external sensors (such as AE sensors, thermocouples, etc.). The external sensor voltage is applied as the gate to source (G-S) voltage on the FET, and modifies the drain to source (D-S) resistance of the FET. This D-S impedance is electrically connected as a load impedance across a SAW transducer, and changes in D-S resistance alter the SAW response reflected from the loaded transducer.

The hybrid FET/SAW sensor-tag wireless interface devices developed previously, and others using advantageous SAW embodiments according to aspects of the present invention described herein, can be used to measure electrical fields and magnetic fields, and by monitoring the magnitude and sign of the electrical field and the magnitude and direction of the magnetic field, can provide information on the voltage and current in high voltage lines (and other current carrying conductors), and on the relative phase (leading or lagging) of the current and voltage—providing information necessary to determine power factor. Such information can be useful, for example, in monitoring the condition of the power lines and other electrical equipment.

U.S. application Ser. No. 15/205,320 filed on Jul. 8, 2016 teaches devices, apparatuses, systems, and methods involving the use of field probes with FETs and SAW sensor-tag wireless interface devices to measure voltage and current in current carrying conductors (CCCs) via measurement of the electric fields and magnetic fields around said CCCs. These applications also teach devices, apparatuses, systems, and methods for determining the relative phase (leading or lagging) of the current and voltage in AC power systems, thereby providing the information necessary to determine power factor. Such information is useful, for example, in monitoring the condition of the power distribution grid.

Systems taught in the above referenced applications include a passive wireless power line voltage, current, and temperature monitoring sensor system. This system utilizes SAW sensors or sensor tags with field probes to measure the electric field and magnetic field around current carrying conductors, which provide proxies for the voltage and current in the conductor. The distribution portion of the power grid runs essentially blind today, i.e., almost no real-time data is available to the grid operator on the condition of the distribution lines and transformers. Pinging smart meters can provide data on power outages at the individual meter level, but automated diagnostic tools that inform operators about the details, locations, and causes of outages are not available. Equally concerning, there are no prognostic tools for the grid that can predict component failures prior to problems occurring. Event driven condition based monitoring (CBM) of the distribution grid would enable operators to identify incipient failures, such as transformers nearing failure, and prioritize preventive maintenance to prevent outages. Since the cost of performing preventative maintenance is much lower than that of responding to an outage, such systems can reduce operating costs while enhancing grid stability. However, there are no current methods for distributed monitoring of the grid that are low enough cost to enable widespread monitoring, particularly at the local distribution level. Low-cost monitoring systems that can be distributed along power lines down to an individual span level of granularity could achieve unprecedented sensitivity in monitoring grid conditions.

The present invention makes improvements over the passive wireless power line voltage, current, and temperature monitoring sensor system disclosed in U.S. application Ser. No. 15/205,320. Hence, it is instructive to briefly review the fundamental aspects of said application. FIG. 17A of the above referenced application (reproduced as FIG. 1A herein) shows a schematic representation of a cut-away view of the interior of the system's casing, which serves as a mechanical housing for the current sensors and the voltage sensors, as well as providing a mounting means to attach the system to a current carrying conductor, including hot stick mounting for power lines. FIG. 17B of the above referenced application (reproduced as FIG. 1B herein) shows a schematic representation of the system with the mechanical housing closed around the conductor. FIG. 18 of said application, which is reproduced as FIG. 2 herein, shows the concept for system operation on a three phase power line. Each of the three phase conductors has a wireless, remotely powered sensor module that corresponds to the system shown in FIGS. 1A and 1B mounted on the line—we will also refer to each of these modules as a 'line mounted unit' herein. A wireless interrogator, also referred to as a reader or a radio, is mounted on the pole below the power lines, or in a similar location that is convenient for wireless interrogation of the line mounted units. The reader sends RF signals that activate the sensor systems on the lines, then receives and digitizes the reflected sensor system RF responses. After local signal processing, sensor data can be transferred to the grid operator via the smart grid network, or via cellphone or wireless mesh networks, or any desired wireless communication system or protocol. A single reader can collect and interpret data from multiple sensors (up to thirty-two or more in the field of view of one interrogator), and can provide data for multiple measurands. Moving all of the digital signal processing (DSP) and wireless communications hardware to a reader that can be mounted in an accessible location away from the power line or transformer being monitored reduces cost and enhances system reliability compared to systems with radios mounted on the high voltage lines. The SAW devices used operate in harsh environments, and have demonstrated lifetimes in excess of several decades in challenging environments.

In the above referenced application, the SAW sensor-tag assembly modules measure voltage and current using a SAW-FET wireless interface device and one or more loops of wire. Placing a loop of wire in (and perpendicular to) the magnetic field generated by a time varying current on an AC power line will cause a current to be induced in the wire loop. For an ideal open circuited loop, this current induces a voltage across the open ends of the loop. By connecting the ends of the loop to a full bridge rectifier and then to the gate of a FET, a time varying drain to source FET impedance can be generated as the current in the power line changes.

FIG. 19 of the above referenced application, reproduced as FIG. 3 herein, shows a schematic representation of a wireless, batteryless SAW current sensor-tag assembly according to aspects of said application. This assembly includes a magnetic field probe sensor connected to a FET interface module, a SAW sensor-tag, and an antenna. The SAW sensor-tags provide a wireless interface with the FET(s), reading the D-S impedance that is being modified by the field probe voltage applied to the FET gate, thus monitoring the magnetic field and ultimately the line current. In an alternate embodiment of the present invention, a Rogowski coil placed around the wire, with the gate and source of the FET attached across the coil ends, can be used instead of a simple loop shown in Figure A, making the voltage less dependent on positioning of the coil relative to the power line. Using a FET interface, the SAW sensor is able to detect current magnitude and direction by detecting the strength and orientation of the magnetic field produced. Data gathered by the interrogator can include current magnitude and direction as a function of time. This data can be collected for each phase of the power system, allowing extraction of the relative current amplitude and phase information.

FIG. 20 of the above referenced application, reproduced as FIG. 4 herein, shows a schematic representation of a wireless, batteryless SAW voltage sensor-tag. Once again, the assembly consists of a field probe that can produce a voltage based on the electric field, a FET interface, a SAW sensor-tag, and an antenna, although in this case the field probe is designed to detect the electric field. Around an AC power line, a time-varying electric field will form with a field intensity that is directly related to the voltage on the line. Field intensity falls off approximately as the inverse of the radial distance from the line. By placing two radially separated probes in the field, a voltage difference between the probes can be measured and used to drive a FET attached to one of the SAW sensor tags disclosed herein. As with the current monitoring case, the time varying impedance of the FET will load the SAW tag and allow wireless reading of the impedance of the FET. As a result, we can monitor the field intensity and by extension, the line voltage. Since the electric field falls off to ground over a distance corresponding to the distance from the line to ground, which can vary from location to location and with different line types, the electric field intensity at any given distance from the line will also vary with these factors. Thus, measuring the electric field intensity will only provide a scaled measure of the voltage on the line, unless a calibration can be done to establish the absolute voltage on the line relative to ground.

A complete line monitoring sensor system for use on AC power systems requires that both current and voltage are measured during both positive and negative portions of the nominally 60 Hz cycle, in order to allow determination of the direction of power flow. Finding the relative phase between the current and voltage also requires accurate zero crossing detection for both signals. FIG. 21 of the above referenced application, reproduced as FIG. 5 herein, shows a SAW wireless interface device configuration with multiple FETs for use in monitoring current (magnitude and direction) and voltage (magnitude and polarity). The field probes taught in the above referenced application that produce voltages V1 and V2 are loops (or a Rogowski coil) for detection of time varying magnetic fields and simple electrical probes (similar to simple monopole antennas) for electrical field measurement.

For field effect transistors (FETs), the Gate to Source (G-S) voltage controls the Drain to Source (D-S) impedance of FET. Some FETs exhibit D-S impedance characteristics that are desirable for use with SAW devices with positive G-S voltages, while others exhibit D-S impedance characteristics that are desirable for use with SAW devices with negative G-S voltages, and yet others function with G-S voltages that span zero voltage.

For the SAW/FET configuration shown in FIG. 5, two voltages are pulled from the field probes (which measure the electric or magnetic field), producing a time-varying differential voltage of magnitude $|V_1(t)-V_2(t)|$, and diodes are used to control application of the probe voltages to one of two FETs depending on the sign of the differential input. On the positive half cycle of the line current or voltage (the waveform shown), V1 is more positive than V2, activating the top diode and applying V1 to the gate of the bottom FET, with V2 applied to the FET source. With proper FET selection, this applied voltage causes an impedance change in the drain to source of the lower FET, which modifies the reflectivity of the attached SAW transducer. Changes in the acoustic wave signal reflected from the transducer can be interpreted as a change in FET resistance, or gate voltage, or ultimately electric or magnetic field strength. On the negative half cycle, V1 is more negative that V2, causing the top diode to shut off and the bottom diode to activate. Now, V2 is routed to the gate of the top FET, and V1 is applied to the source. This modifies the drain to source impedance of the FET attached to the top SAW transducer. In this way, the positive and negative halves of an input differential signal from the field probes are separately identifiable and measurable.

The discussion above assumes ideal diodes that have essentially zero threshold voltage. The use of realistic diodes for input signal routing, however, impacts the performance of this approach, in that most real diodes have non-zero threshold voltages ($V_{TH}$) that can be as much as 0.7V (typically). This is the voltage at which the diode turns on. Thus, the voltages routed to the FET gates are lowered by the threshold voltage of the diodes. The zero voltage crossing point of the input signal also can become difficult to track due to the diode threshold voltage. This turn-on voltage could cause the circuit shown in FIG. 5 to exhibit a 'dead zone' where the system is non-responsive for differential probe outputs from $-V_{TH}$ to $+V_{TH}$ (typically from about −0.7V to +0.7V), though careful selection of low threshold voltage diodes may reduce the dead-zone.

Since the SAW sensor-tag assemblies will be operating in a high voltage power line environment, where transients are not uncommon, it is important to include protective circuitry. FIG. 22 of the above referenced application (reproduced as FIG. 6 herein) shows the circuit of FIG. 5, with added transient voltage suppression (TVS) devices across the two leads of the field probe. This ensures that, even if there is a surge in current or voltage on the line, the differential output of the field probe will not exceed a predetermined level.

A complete line-mounted monitoring system as taught in the above referenced application will include two SAW sensor-tag assemblies as in FIG. 6, one to monitor the line voltage and one to monitor line current. In addition, selected embodiments taught include a SAW temperature sensor to determine the power line temperature. As disclosed in the above referenced application, all of these sensors and sensor-tags can be implemented on a single substrate, or alternatively it is possible to utilize multiple substrates used together to implement the sensor-tag assemblies in one embodiment of the present invention. Two or more die can be used, potentially a reference die and one or more sensing die. The die can be mounted together in a common sample plenum, or the reference device can be hermetically sealed in one package while the sensing die is exposed to the media of interest in another package. The reference die can be combined with one or more sensing die for temperature or other parameters, and hermetically sealed in a package. This package can be electrically connected to an external sensing die, which loads the acoustic response on one of the sensing die or tracks.

SUMMARY OF THE INVENTION

The present invention teaches improved devices, apparatuses, systems, and methods involving the use of field probes with voltage-controlled variable impedance elements and surface-launched acoustic wave devices, including surface acoustic wave (SAW) devices and SAW sensor-tag wireless interface devices to measure voltage and current in current carrying conductors (CCCs) via measurement of the electric fields and magnetic fields around said CCCs. The devices, apparatuses, systems, and methods taught in the present invention include a remotely powered line-mounted measurement unit that requires no connection to electrical ground for operation, and that has no internal energy source, no energy harvesting or power conditioning circuitry, no discrete energy storage components, and no radio. Hence, it is referred to as a 'remotely powered' unit, as the radio signal incident on the unit activates the measurement devices, which respond with device identification information and measurements. The devices, apparatuses, systems, and methods taught in the present invention also provide for determining the phase (leading or lagging) of the current relative to the voltage in AC power systems, thereby providing the information necessary to determine power factor. The present invention also provides for measurement of temperature of the CCC, which may be useful in determining power line conditions to inform grid operation.

The present invention provides physical embodiments of a line monitoring unit with aspects that produce beneficial operation over prior art, and teaches field probe embodiments that have improved performance characteristics over prior art, including probes to detect electric field and separate probes to detect magnetic field. In addition, the present invention provides for monitoring systems and system components, including several preferred circuit configurations that interface one or more electric and/or magnetic field probes with SAW sensor-tag devices to enable wireless measurement of the field probe voltages. Select preferred embodiments incorporate protective circuit elements for suppression of transient voltage surges.

Still other aspects, features, and advantages of the present invention are apparent from the following detailed description, simply by illustrating exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The present invention will be understood more fully from the detailed description given below and from the accompanying figures and drawings of various embodiments of the invention, which, however, should not be taken to limit the invention to the specific embodiments, but are for explanation and understanding only.

DETAILED DESCRIPTION OF THE INVENTION

Figure 1A:
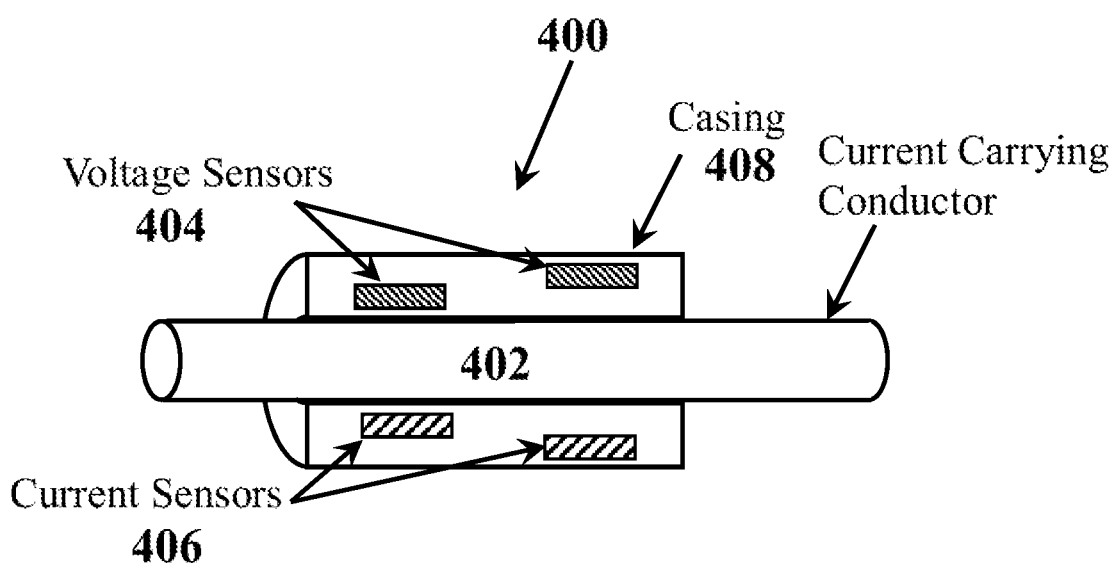
FIG. 1A shows a cut-away view of the interior of a line-mounted voltage and current monitoring system according to U.S. application Ser. No. 15/205,320. Note the two voltage sensors located at different radial positions relative to the current carrying conductor, and (in this example) at different locations along the axis of the conductor.
Figure 1B:
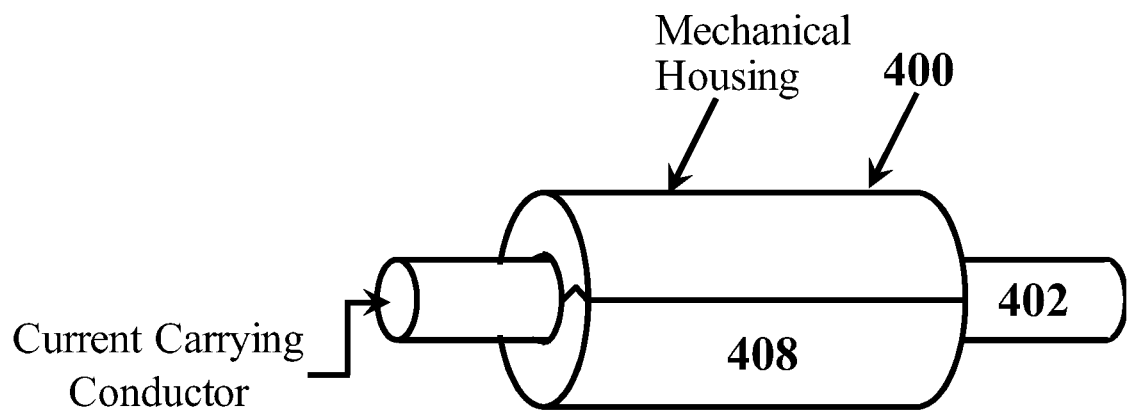
FIG. 1B shows the mechanical housing enclosing the conductor for the system shown in FIG. 1A according to U.S. application Ser. No. 15/205,320.
Figure 2:
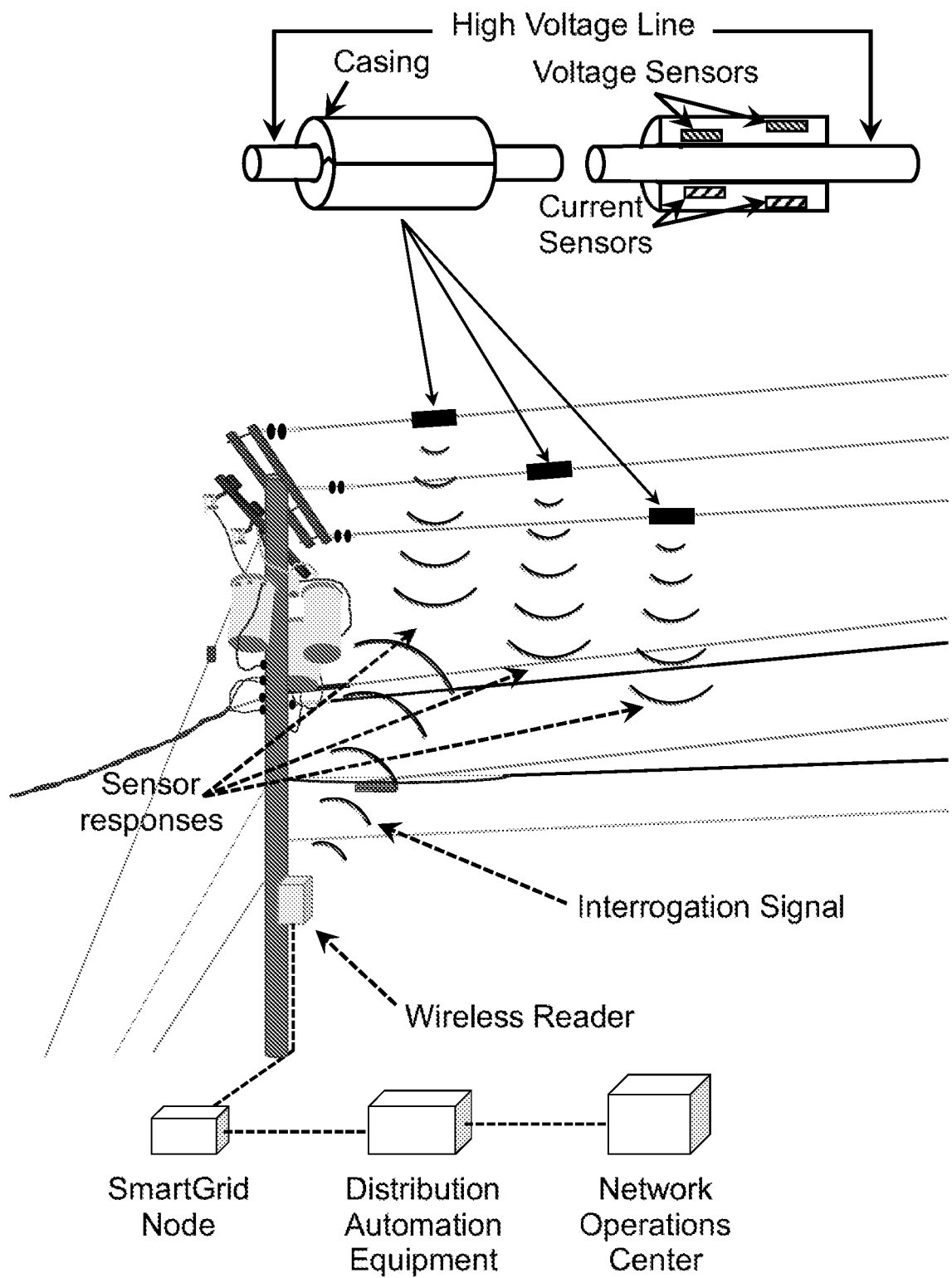
FIG. 2 shows the operational concept of a wireless power line monitoring system comprising three line-mounted systems (one of which is depicted in FIGS. 1A and 1B) and one pole-mounted radio, in operation on a three phase power line according to aspects of U.S. application Ser. No. 15/205,320.
Figure 3:
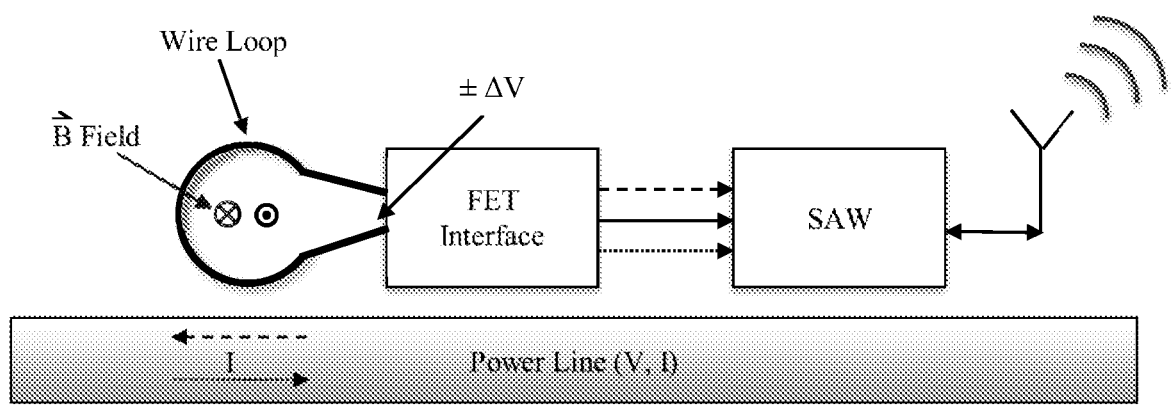
FIG. 3 shows a schematic representation of a wireless, batteryless SAW sensor-tag assembly for current measurement according to aspects of U.S. application Ser. No. 15/205,320.
Figure 4:
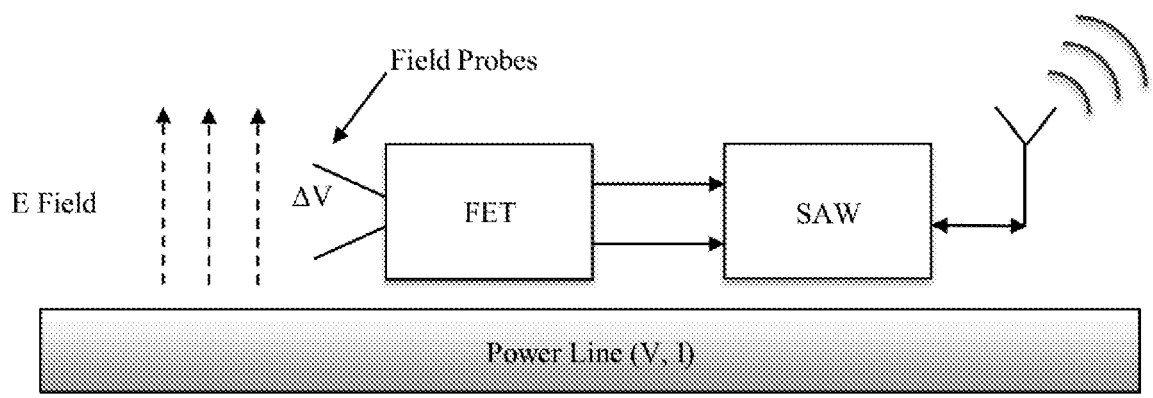
FIG. 4 shows a schematic representation of a wireless, batteryless SAW sensor-tag assembly for voltage measurement according to aspects of U.S. application Ser. No. 15/205,320.
Figure 5:
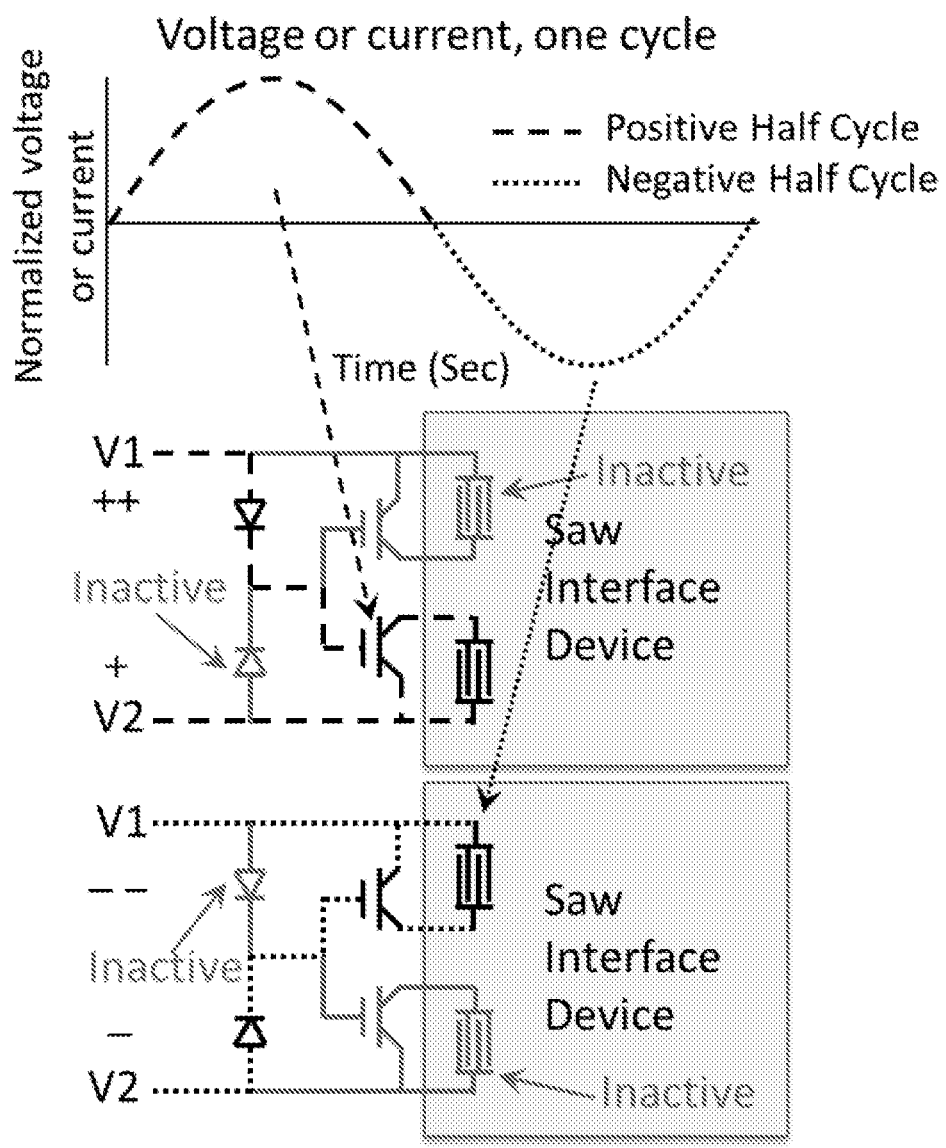
FIG. 5 shows a SAW wireless interface device configuration with multiple FETs for use in monitoring current (magnitude and direction) and voltage (magnitude and polarity) according to aspects of U.S. application Ser. No. 15/205,320.
Figure 6:
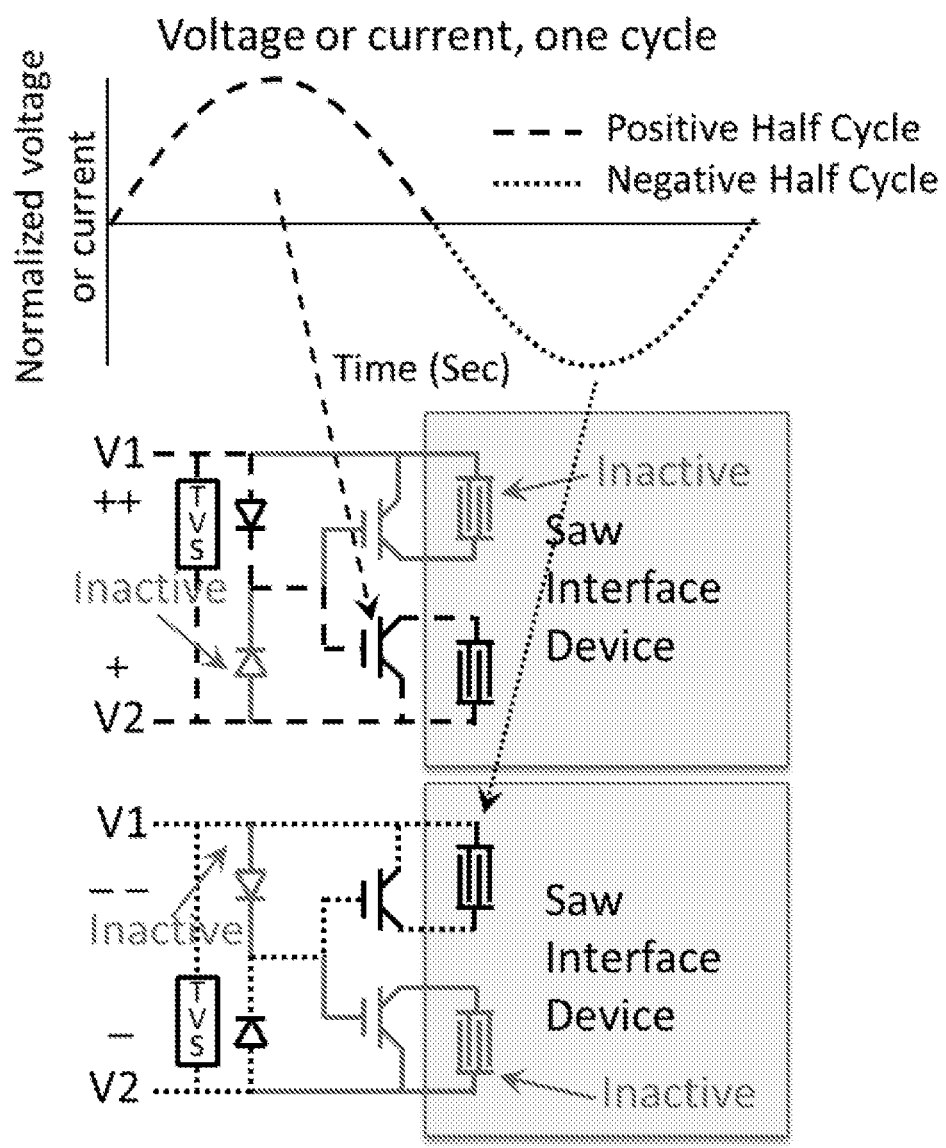
FIG. 6 shows the circuit of FIG. 5 with added transient voltage suppression (TVS) devices across the two leads of the field probe according to aspects of U.S. application Ser. No. 15/205,320.

The present invention teaches improved devices, apparatuses, systems, and methods involving the use of field probes with voltage-controlled variable impedance elements and surface-launched acoustic wave devices, including surface acoustic wave (SAW) devices and SAW sensor-tag wireless interface devices to measure voltage and current in current carrying conductors (CCCs) via measurement of the electric fields and magnetic fields around said CCCs. The devices, apparatuses, systems, and methods taught in the present invention include a remotely powered line-mounted measurement unit that requires no connection to electrical ground for operation, and that has no internal energy source, no energy harvesting or power conditioning circuitry, no discrete energy storage components, and no radio. Hence, it is referred to as a 'remotely powered' unit, as the radio signal incident on the unit activates the measurement devices, which respond with device identification information and measurements. The devices, apparatuses, systems, and methods taught in the present invention also provide for determining the phase (leading or lagging) of the current relative to the voltage in AC power systems, thereby providing the information necessary to determine power factor. The present invention also provides for measurement of temperature of the CCC, which may be useful in determining power line conditions to inform grid operation.

The present invention provides physical embodiments of a line monitoring unit with aspects that produce beneficial operation over prior art, and teaches field probe embodiments that have improved performance characteristics over prior art, including probes to detect electric field and separate probes to detect magnetic field. In addition, the present invention provides for monitoring systems and system components, including several preferred circuit configurations that interface one or more electric and/or magnetic field probes with SAW sensor-tag devices to enable wireless measurement of the field probe voltages. Select preferred embodiments incorporate protective circuit elements for suppression of transient voltage surges.

Improved field probes for both the electric field (a proxy for line voltage) and magnetic field (a proxy for line current) are provided in the present invention. We will discuss each separately.

Electric field probes: As described previously above, around an AC power line, a time-varying electric field will form with a field intensity that is directly related to the voltage on the line. Field intensity falls off approximately as the inverse of the radial distance from the line. By placing two radially separated probes in the field, a voltage difference between the probes is produced. U.S. application Ser. No. 15/205,320 teaches that this voltage can be used to drive a FET attached to one of the SAW sensor tags disclosed herein. The time varying impedance of the FET will load the SAW tag and allow wireless reading of the impedance of the FET. As a result, we can monitor the field intensity and by extension, the line voltage. Since the electric field falls off to ground over a distance corresponding to the distance from the line to ground, which can vary from location to location and with different line types, the electric field intensity at any given distance from the line will also vary with such factors. Thus, measuring the electric field intensity will only provide a scaled measure of the voltage on the line, unless a calibration can be done to establish the absolute voltage on the line relative to ground.

Also in U.S. application Ser. No. 15/205,320, the probes used for electrical field measurement were simple conductive electrical 'point' probes, similar to monopole antennas. These probes were each intended to sample the electrical field at one radial distance from the power line, with a differential voltage produced between the two probes. Other prior art power line monitoring systems utilize one or a group of conductive plates, including flat rectangular plates, to sample the electric field in discrete locations. Certain systems utilize four flat plates located the same radial distance from the line, oriented along the four corners of a square, but not forming a continuous conductive structure around the line.

Electric field probes known in the prior art are subject to significant performance variations as the location of the energized line relative to the field probe(s) varies, and are also significantly impacted by the dielectric properties of the region surrounding the field probes, including the dielectric and other properties of the environment immediately surrounding the line-mounted units. Accumulation of snow and ice can cause problems with system readings, as the electric field will fall off more slowly in a high dielectric constant environment.

The present invention teaches a new type of electric field probe that is inherently less sensitive to the location of the energized line relative to the probe, and is also less impacted by changes in the line-mounted unit's environment. From basic electrostatics, we know that the electric field of a uniform line charge is directed radially outward or inward depending on the polarity of the charge on the line. Since the voltages on power lines operate at very low frequency (generally in the 50 Hz to 60 Hz range), at any given instant in time we can view the electric field as nearly a static field that is radial in direction. Gauss's Law tells us that the net electric flux through any closed surface is proportional to the net charge enclosed by the surface. Considering a cylindrical closed surface around a short section of a power line, we know from symmetry that all the electrical flux is going radially in or out though the circumferential walls of the cylinder—i.e. no flux leaves through the ends. Thus, the electrical field immediately around any small section of a power line depends only on the net charge on that section of the line. For a given charge on the power line at any instant in time we have a defined electric field. Hence a cylindrical conductive field probe that intercepts all of the flux from a section of the power line should provide a reading of line voltage that is essentially independent of changes in the environment external to the field probe. The electric field between the power line and the cylindrical field probe depends only on the charge on the power line, so the voltage drop between the line and the field probe would not change when the dielectric properties of the environment outside the probe change. For instance, if a large electrically grounded metal truck were to park under a power line monitoring system, bringing the ground location closer to the line, what would happen to the voltage on our cylindrical conductive field probe? The electric field immediately around the line is dependent only on the line charge. The electric field lines terminate in the conductive, electrically isolated cylindrical field probe, as charges reorganize and separate to produce zero electric field inside the conductor. So if net negative charge moves to the inside of the conductive probe, net positive charge moves to the outside of the conductor. The result is the same electric field (and voltage drop) inside the cylindrical probe as before, no electric field and no voltage drop across the conductive probe, and a net positive charge (and the same voltage as on the interior of the probe conductive cylinder) on the exterior of the probe. From the exterior of the probe, the electric field falls off to zero at the ground—or in this case at the top of the truck. So the electric field falls off faster with distance from the probe when the truck is located under the line than when no truck is present and the distance to the ground is longer. But integrating the field that falls off more quickly over a shorter distance should result in the same voltage at the probe surface as integrating the more slowly varying field over a longer distance. Circular or cylindrical electric field probes according to aspects of the present invention take advantage of this symmetry, while other prior art probes do not. Of course, while circular or cylindrical field probes are a preferred embodiment of the present invention, field probes incorporating conducting Gaussian surfaces of any shape that fully enclose the charged conductor (or the current carrying conductor) will provide similar benefits, i.e. since the electrical field immediately around any small section of a power line depends only on the net charge on that section of the line, any conductive field probe that intercepts all of the flux from a section of the power line (Gaussian surface) will provide a reading of line voltage that is essentially independent of changes in the environment external to the field probe, provided the Gaussian surface is electrically isolated from the central conductor.

Figure 7:
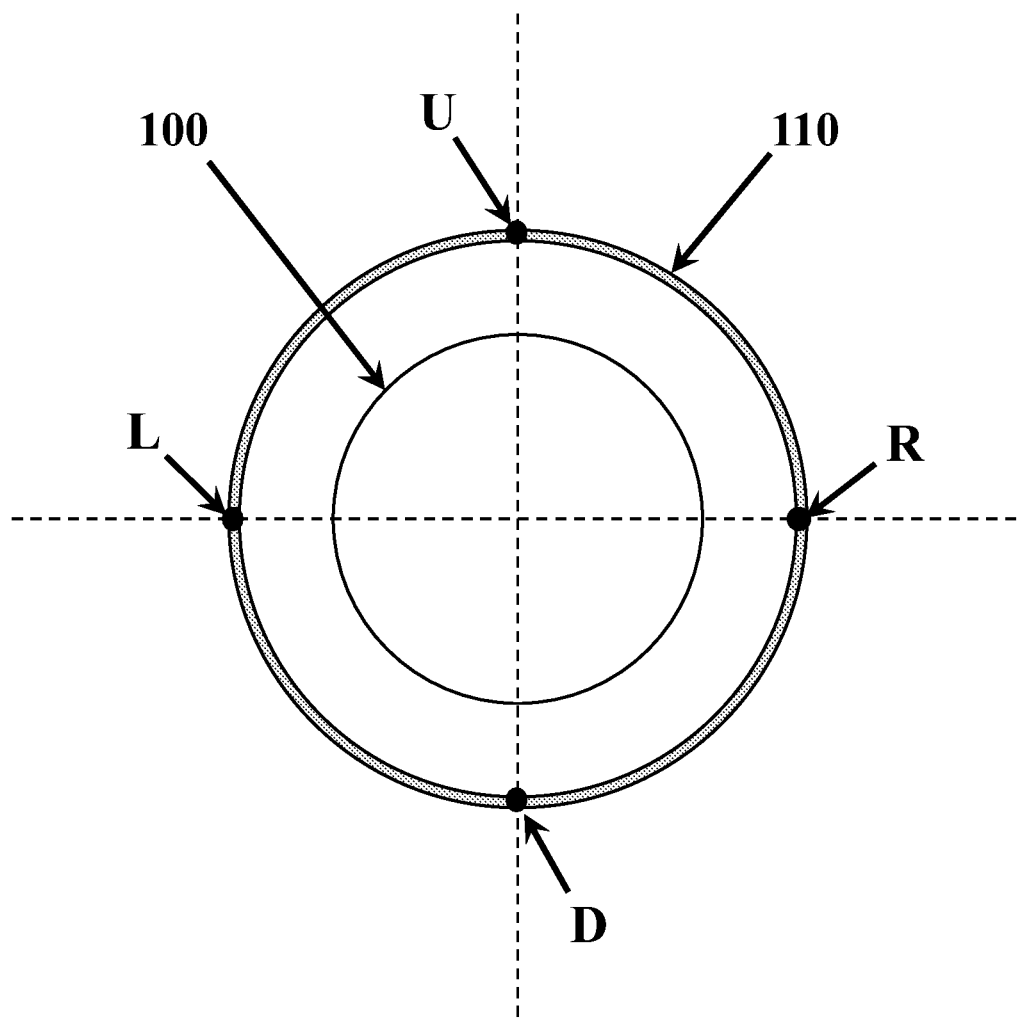
FIG. 7 shows a power line conductor located within a set of four points at which voltage will be calculated, both in and air environment and on a conductive circular electric field probe.

To understand the beneficial features of the operation of this improved electric field probe according to aspects of the present invention, we first consider what the voltages would be at specific points in space surrounding an energized line, assuming empty space (or air) in the region around the line. FIG. 7 shows a power line 100, which in this example analysis has a radius of 0.5 inches and is located 10 m above the ground, in air. We consider what voltage is developed at the points (shown by dots) located on the left (L), right (R), top or upper side (U) and bottom or down side (D) of a circular ring of air (relative dielectric constant of 1) that is at a radius of 20 mm from the center of the conducting line. When the line is energized to 14 kV, the voltages at each point are given in Table 1. When the hypothetical 'ring' in air that is defined by the four points is concentric with the line conductor, the conductor offset in Table 1 is 0 mm. We note that for this configuration (data in the first row of Table 1), with the conductor centered within the ring formed by the four points, the voltages on the left and right sides are equal, while the top (U(V)) is at a slightly higher voltage and the bottom (D(V)) is at a slightly lower voltage. As the line conductor is moved to a position that is offset within the hypothetical ring in air defined by the four points, we see that the voltages at each point change accordingly (data in last two rows of Table 1). Moving the line to the left causes the voltage at the left point (L(V)) to increase an the voltage at the right point (R(V)) to decrease, as expected. The top and bottom point voltages (U(V) and D(V) respectively)

both decrease slightly, as the line conductor is being moved slightly further away from these points.

TABLE 1

Point Voltages in Empty Space (or Air) with Offset Line Conductor

| Conductor Offset (to the left) | L(V) | R(V) | U(V) | D(V) | Avg(V) |
|---|---|---|---|---|---|
| 0 mm | 13675 | 13675 | 13683 | 13670 | 13676 |
| 1 mm | 13713 | 13640 | 13682 | 13670 | 13676 |
| 2 mm | 13750 | 13608 | 13680 | 13665 | 13676 |

The data in Table 1 illustrate a fundamental problem with electric field probes according to the prior art. The voltage detected by any given probe is very sensitive to the precise location of the probe relative to the center of the power line. Even a 1 mm offset can cause the detected voltage to vary by tens of volts for a line voltage of 14 kV (or more than 0.25%). Larger offsets lead to larger position-induced errors, and maintaining positioning accuracies of better than a few millimeters can be difficult in such systems. However, we do note that the average voltage for all four points remains constant with this offset, due to the 1/R nature of the electric field and the symmetry of these points. This is likely the feature being taken advantage of by commercial line monitoring systems that use four plates for electric field sensing. However, if any one of the sensor plates is impacted by external factors (such as snow accumulating on the top of the line unit, or a large truck parking below the line unit, or voltages from adjacent phases or other lines, etc.), then the average of the four voltages will change less than the voltage of the individually affected probe plate would change.

Next a thin conductive ring (110 in FIG. 7), with inner radius of 20 mm (identical to the hypothetical ring defined previously by the four points in air), and (arbitrary) thickness of 0.5 mm in the radial direction. Since any conductor is an equipotential surface, the voltages at L, U, R, and D in FIG. 7 must be equal. Simulating the potentials we find (Table 2) that this is indeed the case. Also, offsetting the line conductor within the conductive ring introduces a much smaller change in point voltages (13V) for a 2 mm offset for the conductive circle, rather than 75V (L), 67V (R), 3V (U), and 5V (D) for point in air. However, we note that for this configuration, the average voltage does change with line conductor offset, which is undesirable.

TABLE 2

Point Voltages on a Conductive Ring with Offset Line Conductor

| Conductor Offset (to the left) | L(V) | R(V) | U(V) | D(V) | Avg(V) |
|---|---|---|---|---|---|
| 0 mm | 13675 | 13675 | 13675 | 13675 | 13675 |
| 1 mm | 13678 | 13678 | 13678 | 13678 | 13678 |
| 2 mm | 13688 | 13688 | 13688 | 13688 | 13688 |

Figure 8:
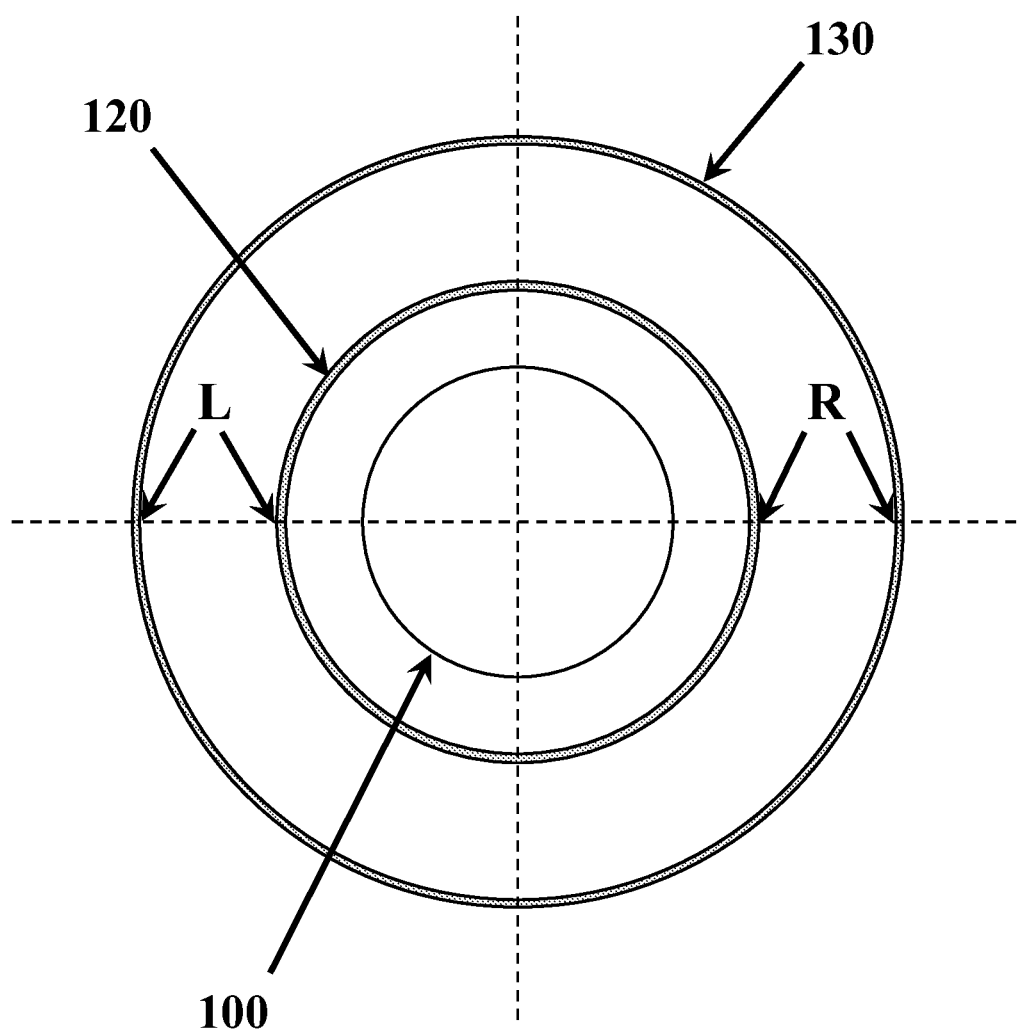
FIG. 8 shows a power line conductor located within a pair of concentric circular conductive electric field probes, which when used together produce a single differential electric field probe, according to aspects of the present invention.

FIG. 8 shows an improved differential ring probe according to aspects of the present invention, which is beneficial for measuring electric fields. We will consider two concentric rings (120 and 130), with inner diameters of 20 mm (120) and 30 mm (130), first in air and then rings made of conductive materials. The voltage differentials between the two points on the right (R) and between the two points on the left (L) (shown by arrows in FIG. 8) will be evaluated for each configuration. The differential voltage between the outer and inner points or rings will be determined, and the variation in differential voltages will be calculated for various line conductor offsets.

Table 3 shows the differential voltages between the two points on the left (L) and between the two points on the right (R), and tabulates the difference between the differential voltage on the left and on the right, and also shows the total change in differential voltage caused by offsetting the line conductor by up to 2 mm.

TABLE 3

Differential Voltage in Empty Space with Offset Line Conductor

| | Left (V) | Right (V) | L-R (V) |
|---|---|---|---|
| rx = 0 mm | 271.61 | 271.61 | 0 |
| rx = 1 mm | 283.1 | 261.02 | 22.08 |
| rx = 2 mm | 295.62 | 251.24 | 44.38 |
| max − min | 24 | 20.37 | |

Table 4 shows the differential voltage between concentric conductive rings, for line conductor offsets of up to 2 mm. Note that the nature of the conductors is such that the differential voltage between the two concentric conductive rings is the same for all points on the rings. Also note that the use of concentric metal conductors results in differential voltages that vary only slightly with offsets of the line conductor relative to the concentric conducting rings. This improved differential concentric conductor electric field probe according to aspects of the present invention produces differential voltages that vary by only 0.24 Volts for a 2 mm line offset, as compared to a >20 Volt variation for differential point probes located on the left and right of the line. This is an improvement of ~100-fold, and the resulting variation in differential voltage is only 0.09% for this example. Hence, it is clear that using differential concentric conductive field probes that fully encircle the line conductor produces differential voltages that are relatively robust and not impacted much by the position of the line conductor relative to the position of the probe(s).

TABLE 4

Differential Voltage Between Concentric Conductive Rings with Offset Line Conductor

| | Left (V) | Right (V) | L-R (V) |
|---|---|---|---|
| rx = 0 mm | 272.22 | 272.22 | 0 |
| rx = 1 mm | 272.28 | 272.28 | 0 |
| rx = 2 mm | 272.46 | 272.46 | 0 |
| max − min | 0.24 | 0.24 | |

Figure 9:
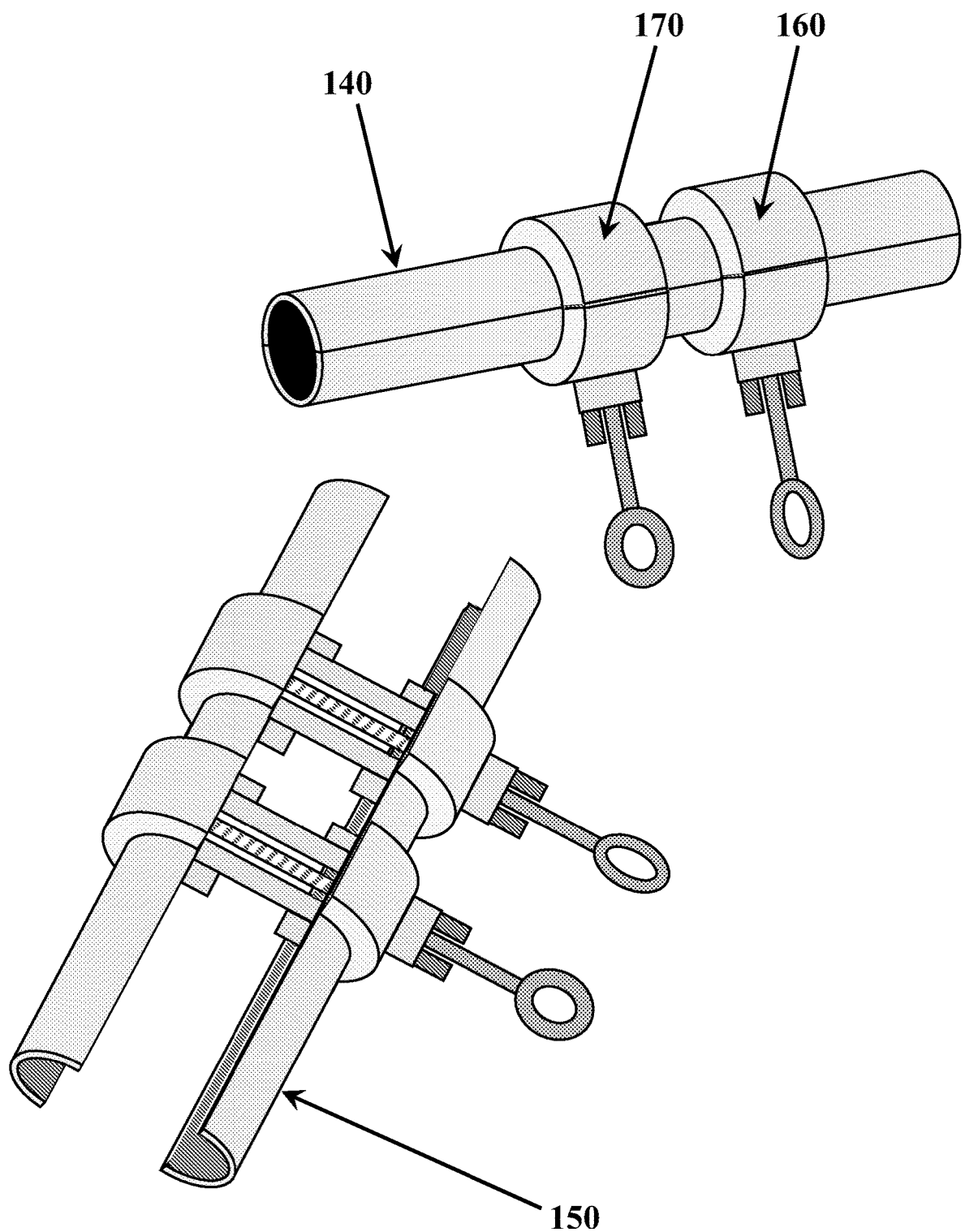
FIG. 9 shows three line unit metal substructures, which include two line clamps and a metal cylinder cut lengthwise, according to aspects of the present invention.

But can we eliminate even this small variation due to line location relative to the field probes? The present invention utilizes a cylindrical metal pipe (or a pipe made of other conductive material), cut lengthwise into two pieces, to form the backbone of the line-mounted monitoring unit. Said two pieces can be equal or unequal in size. This metal backbone is placed in mechanical and electrical connection with the line conductor, causing the entire cylinder to become an equipotential surface—that is at the same potential as the power line. How do we make the mechanical and electric connections to the power line? Any suitable means can be used to produce both the electric connection and the mechanical connection to the line. Hot line clamps are industry-standard metal clamps that can be used to mount hardware onto the power lines. A large eyebolt at the bottom of the hot line clamp can be tightened using a long fiberglass pole called a "hot-line stick". One preferred embodiment of the metal support structure of a line-mounted unit (two of which are shown in FIG. 9) includes two hot line clamps 160 and 170 that are mechanically and electrically connected to the cylindrical metal pipe 140 (or other conductive material pipe) that forms the foundation of the line-mounted unit. In this preferred embodiment, both clamps can be opened wide 150 to allow the two sides of the pipe to be far enough apart that the system can be hung onto a power line. One clamp 160 that is used to mechanically and electrically connect the system to the line is then tightened. This pushes the line conductor up against the top of the metal pipe. Next, the second line clamp 170 is tightened, closing the bottom portion of the conducting cylinder (and the attached system components with it) tightly against the top of the system. Means may be included to ensure good electrical connections between the upper and lower portions of the conductive pipe and attached field probes. Such means may include flexible conductive connectors, pogo pins, clips, and others.

Once closed, the conducting cylinder provides an equipotential surface that is at the same potential as the line. Since the dimensions of the cylinder are well known, this configuration provides a fixed geometry that will be at the line voltage, no matter what size the line conductor is (provided it fits within the cylinder and line clamp). Conductor offset also becomes an irrelevant factor, since the cylinder will always be in close electrical contact with the line—in fact in most cases the line conductor will be offset all the way against the inside top of the cylinder by the clamping action—but the entire cylinder is at the line voltage. Hence, we can develop optimized differential ring electric field probes that measure voltage relative to this known, fixed 'effective line' geometry provided by the conductive cylinder.

Another advantage to the use of a conductive cylinder clamped to the power line is protection of the line-mounted unit's components from electrical transients caused by the process of mounting the unit on the line. When an uncharged (or previously grounded) object is brought in close proximity to an AC power line, the time-dependent potential difference between the line and the object can lead to electrical discharge until the object is in electrical contact with the line. Once in contact, the line mounted object 'floats' with the line voltage, which can be viewed as a relative 'ground' for the line mounted unit. These large electrical discharges can harm electronic components, even robust SAW devices, if proper protective elements are not included in the line-mounted units. Transient voltage suppression (TVS) devices should preferably be connected across any ports that may be subject to a voltage surge due to discharge or transient conditions on the line. While it is not shown in the figures, the present invention includes a TVS device between the antenna hot line and the ground plane of the line mounted unit. When the unit is mounted on the line, the line generally discharges to the ground plane of the system. The larger the system ground plane, the better the system is able to absorb the charging effects of system mounting. Thus, using the conductive cylinder (which can be much larger than the ground plane of any PCB or multichip modules used in the line mounted unit) as a common ground for the entire line mounted unit helps to 'spread out' the effects of charging and discharging during system mounting. Use of a TVS device across the antenna port also places this protective device across the SAW input/output transducer, which prevents mounting transients from destroying the transducer. This TVS device will also serve a protective role should line transients induce a signal on the antenna that is larger than we would desire to apply to the SAW transducer.

Figure 10:
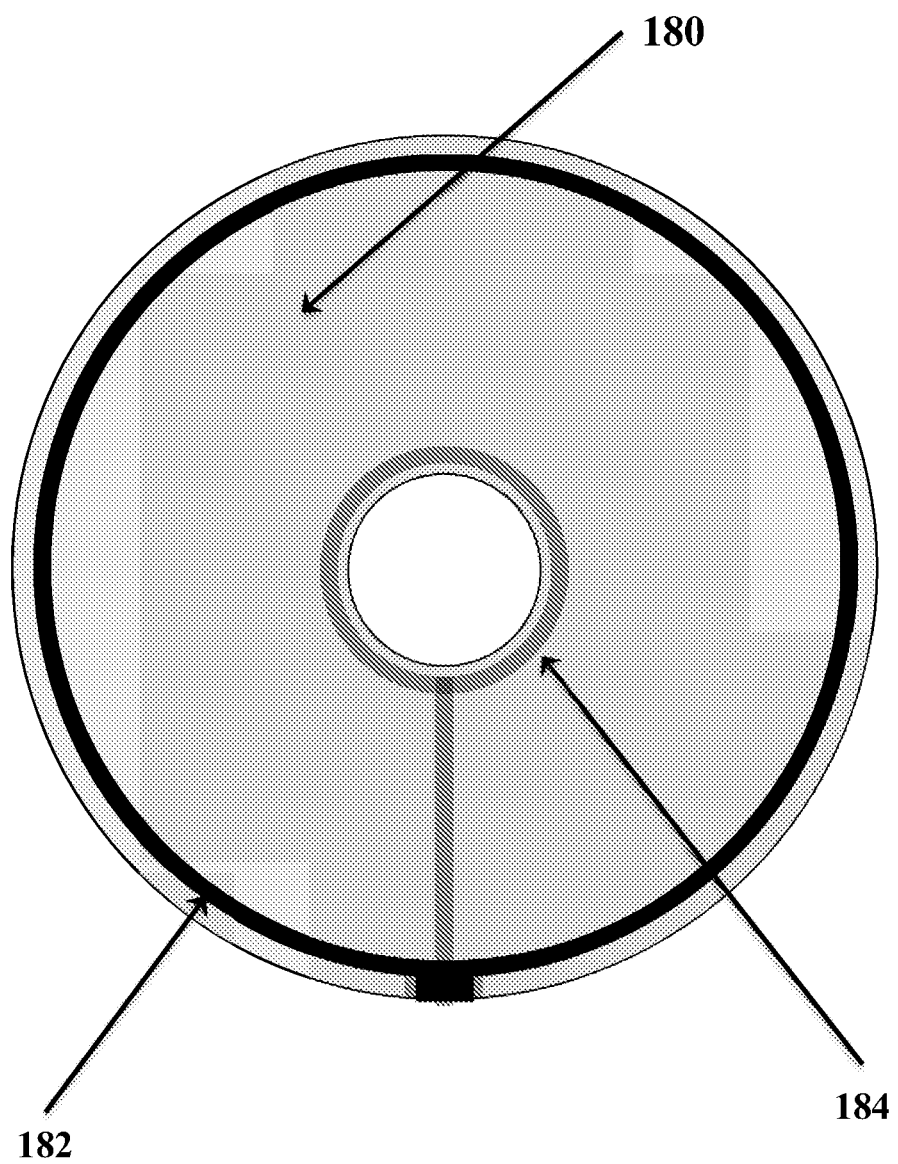
FIG. 10 shows a schematic representation of a simple differential circular electric field probe embodiment, according to aspects of the present invention.

FIG. 10 shows the basic concept of differential ring electric field probes. A dielectric substrate 180 mechanically supports two or more concentric circular conductive traces 182 and 184. In FIG. 10, conductive trace 182 is on the face of the substrate closest to the observer, while conductive trace 184 is on the back of the dielectric substrate. This allows both traces to be brought out electrically near the same location on the edge of the board. This type of probe can be implemented in two sections, to allow the probe to be opened and closed over the power line. In one preferred embodiment, the probe would be attached to the top and bottom of the line unit conductive cylinder. Voltage differences can be obtained between any two circular or cylindrical probe sections. While FIG. 10 shows only 2 circular traces 182 and 184, it may be advantageous in certain circumstances to have three, four, or more conductive sections (all of which are circular or cylindrical in geometry) that are located at different radial locations relative to the center of the conductive cylinder, and may be co-located along the length of the power line, or may be offset by a convenient amount along the line length.

The electrical field probes shown can operate by closing (to make electrical contact between the appropriate top and bottom sections) around the conductive cylinder at the same location along the power line (a preferred embodiment), or upper and lower portions can be somewhat offset laterally and connected through electrical contacts or wires.

Differential electrical field probe voltage output (for a given line voltage) is controlled directly by the field probe materials and geometry. The larger the radial separation between any two field probe conductive sections, the greater the voltage differential produced. The closer the field probe conductive segments are to the power line, the higher the electric field and thus the larger the differential voltage produced for a given radial separation. The larger the dielectric constant of the probe substrate or support material, the lower the output differential voltage. It is possible with proper spacing to produce differential field probe voltage outputs ranging from about 10V to several hundred volts.

Differential voltages of hundreds of volts can be applied directly across the thickness of SAW die (from the top surface on which the SAW propagates to the bottom surface) using metal regions on the top of the die and either metallic bases with conductive epoxy under the die or metallized regions on the back of the die. In this embodiment of the present invention, no voltage-controlled variable impedance elements are needed, and instead the differential probe output voltages are fed directly to the SAW die surfaces.

In several preferred embodiments however, it may be desirable to utilize a voltage divider, for instance via a resistive divider, across the output of the field probe. Using very large resistance values in such a resistive divider prevents the field probes, which are essentially capacitors, from sending significant currents through the resistive divider. This allows the field probes to act as nearly ideal voltage sources. Adjusting the capacitance of the field probes, the resistances used in voltage dividers, and the isolation or connection of individual probe conductive segments to other system components can lead to interesting charging and discharging effects, and caution must be used to avoid such circumstances in order to not introduce undesired signal components that depend more on dV/dt than on V(t) on the line.

Figure 11:
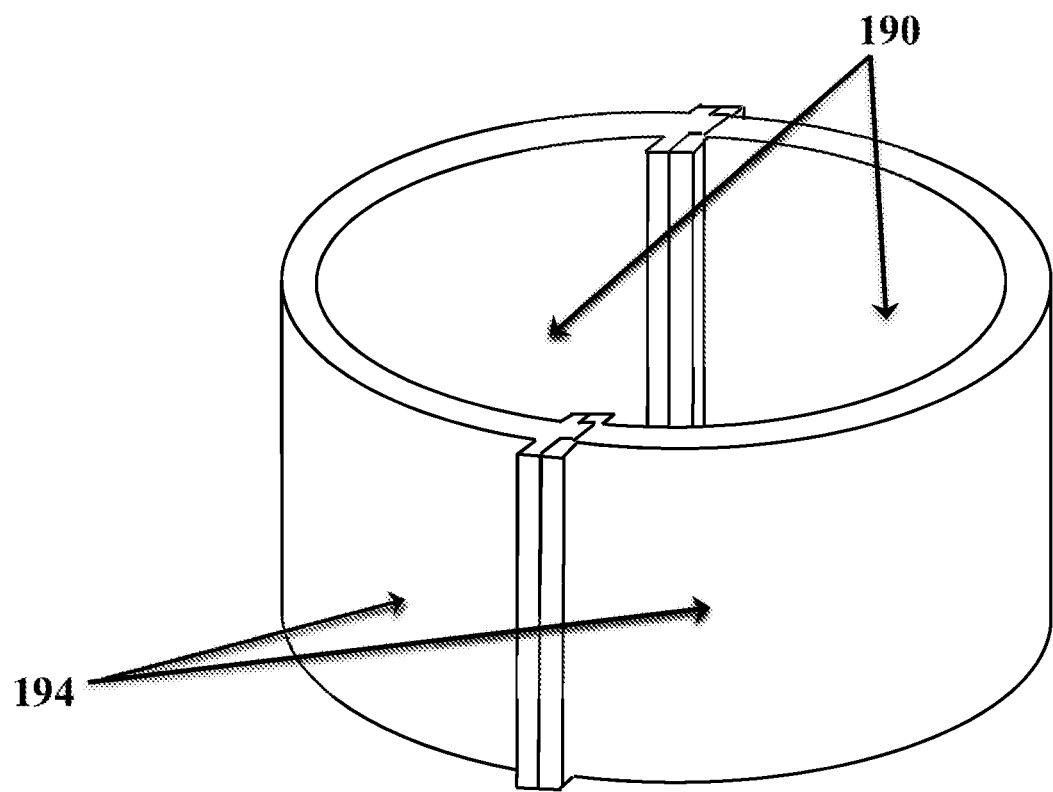
FIG. 11 shows a schematic representation of four differential electric field probes according to aspects of the present invention.
Figure 11:
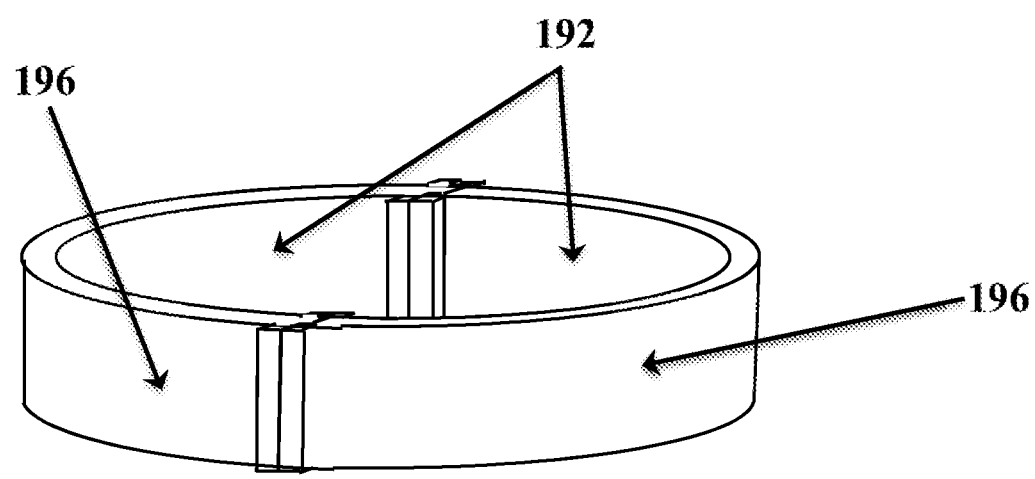

FIG. 11 shows a schematic representation of two differential electric field probes out of a set of four that was fabricated with diameters of up to 6 inches and lengths along the line dimension of 0.5 inches up to 4 inches. Each probe consists of plastic dielectric supports with copper tape conductive sections on the inner surfaces 190, 192 and outer surfaces 194, 196. With two copper tape layers, one differential output voltage is obtained. Other versions of these probes were built with more than two layers of copper tape, separated by plastic spacers and/or Kapton tape. The large diameter of these field probes places them in a region where electric field intensity is lower than it is close to the power line, and hence at lower absolute voltages. The small spacing between the conductive layers reduces the output differential voltages.

Figure 12:
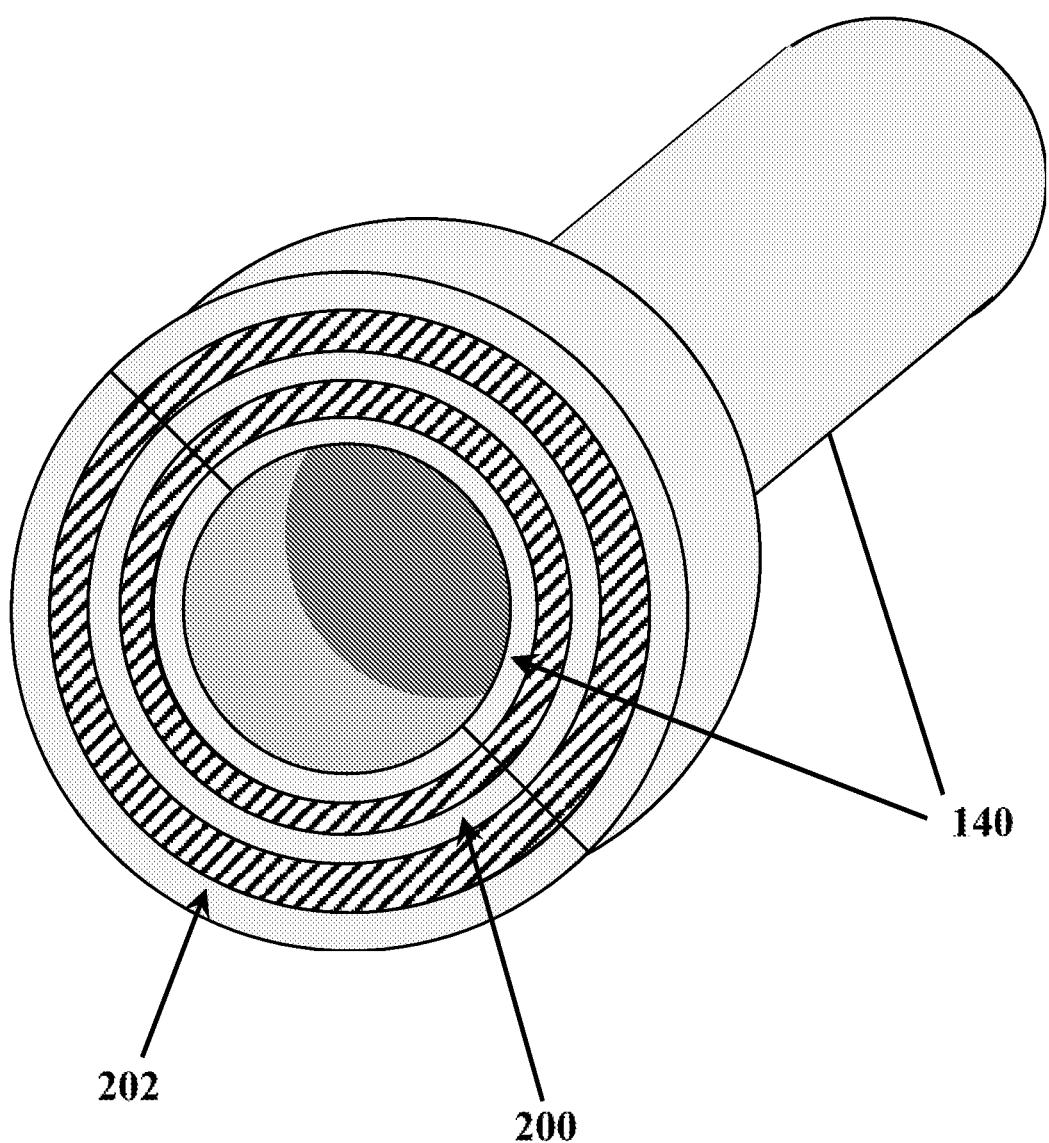
FIG. 12 is a schematic representation of a smaller, industrial differential electric field probe embodiment according to aspects of the present invention, where epoxy is used to separate concentric metal segments.

FIG. 12 shows a smaller, industrial differential electric field probe embodiment, where epoxy is used to separate concentric metal segments 140, 200, and 202. This probe can be used to produce one differential voltage between the two outer metal sections, or the center metal pipe can be used as a connection, to produce two or more differential voltages—between the pipe and the center metal section, between the center and outer metal sections, and between the pipe and the outer metal sections. Shared connections to the metal segments can produce effects in the circuits to which the probes are attached, and hence alternate field probe structures that produce two or more differential voltages without common electrical nodes may be desirable.

Figure 13:
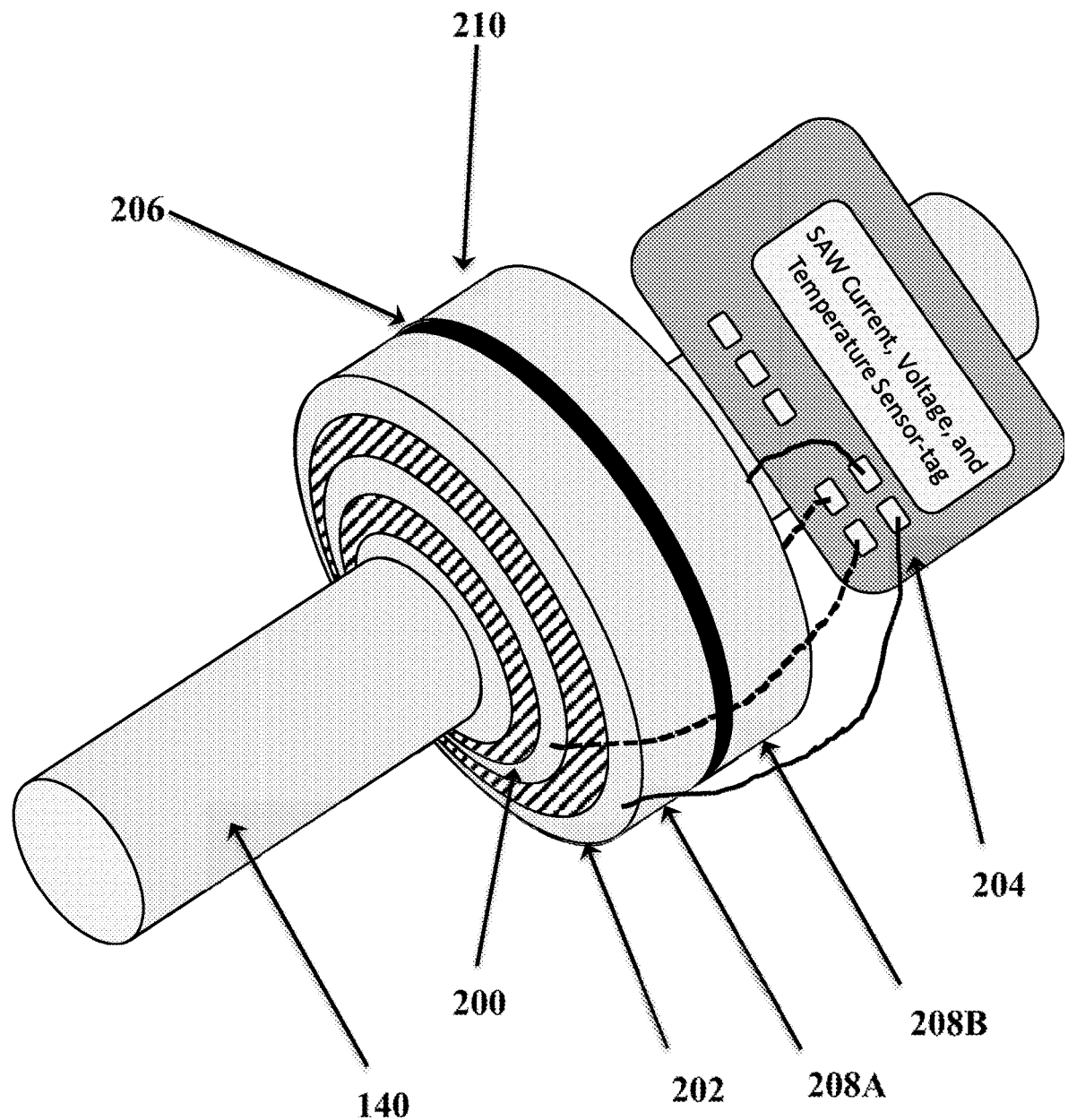
FIG. 13 is a schematic representation of a dual-differential electric field probe according to aspects of the present invention where both probe sections are isolated from the conductive cylindrical line unit support.

FIG. 13 is a schematic representation of such a dual-differential electric field probe 210 where both probe sections 208A and 208B are isolated from the conductive cylindrical line unit support 140. A single differential voltage is produced between the outer 202 and middle 200 metal sections on each side of an insulating spacer 206 (black in FIG. 13). The cylindrical conductive pipe 140 serves as the electrical ground for the SAW 204 board, but neither probe voltage utilizes connections to the center cylinder.

Figure 14:
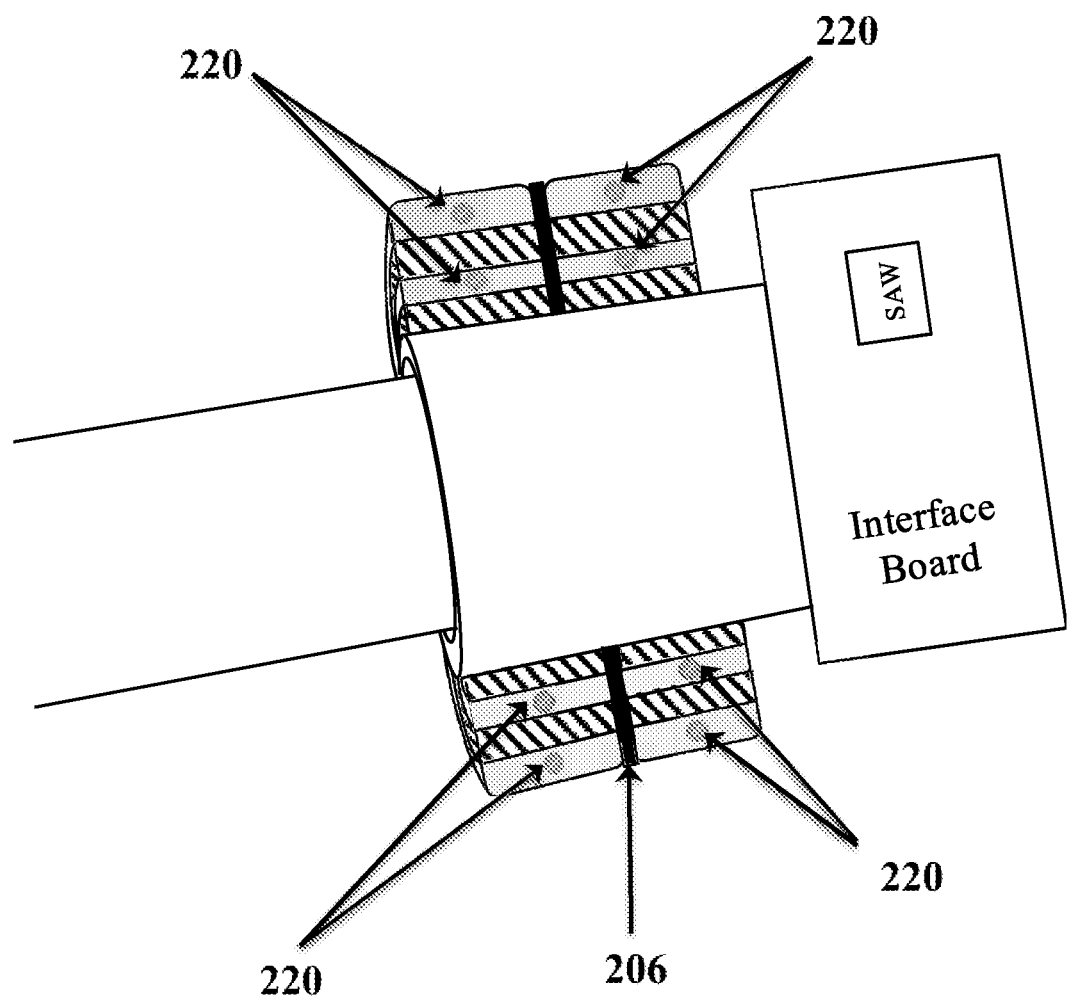
FIG. 14 is a schematic representation of the dual-differential electric field probe of FIG. 13, opened to show the internal insulating layer and the connectors used to ensure good electrical contact between the top and bottom of the probe, according to aspects of the present invention.

FIG. 14 is a schematic representation of the dual-differential electric field probe 210 of FIG. 13, opened to show the internal insulating layer 206 and the connectors 220 used to ensure good electrical contact between the top and bottom of the probe, according to aspects of the present invention.

Magnetic field probes are discussed below, but also can produce a single differential voltage or two or more differential voltages. The probe voltages (divided down if appropriate) are then applied to the control inputs of a voltage controlled variable impedance device, of which a FET is just one example. FETs were the first embodiment studied, and hence we teach several circuit embodiments that utilize FETs. These are exemplary in nature, and it is understood that the use of more general voltage controlled variable impedance devices is within the scope of the present invention. Several useful circuit configurations follow.

Figure 15:
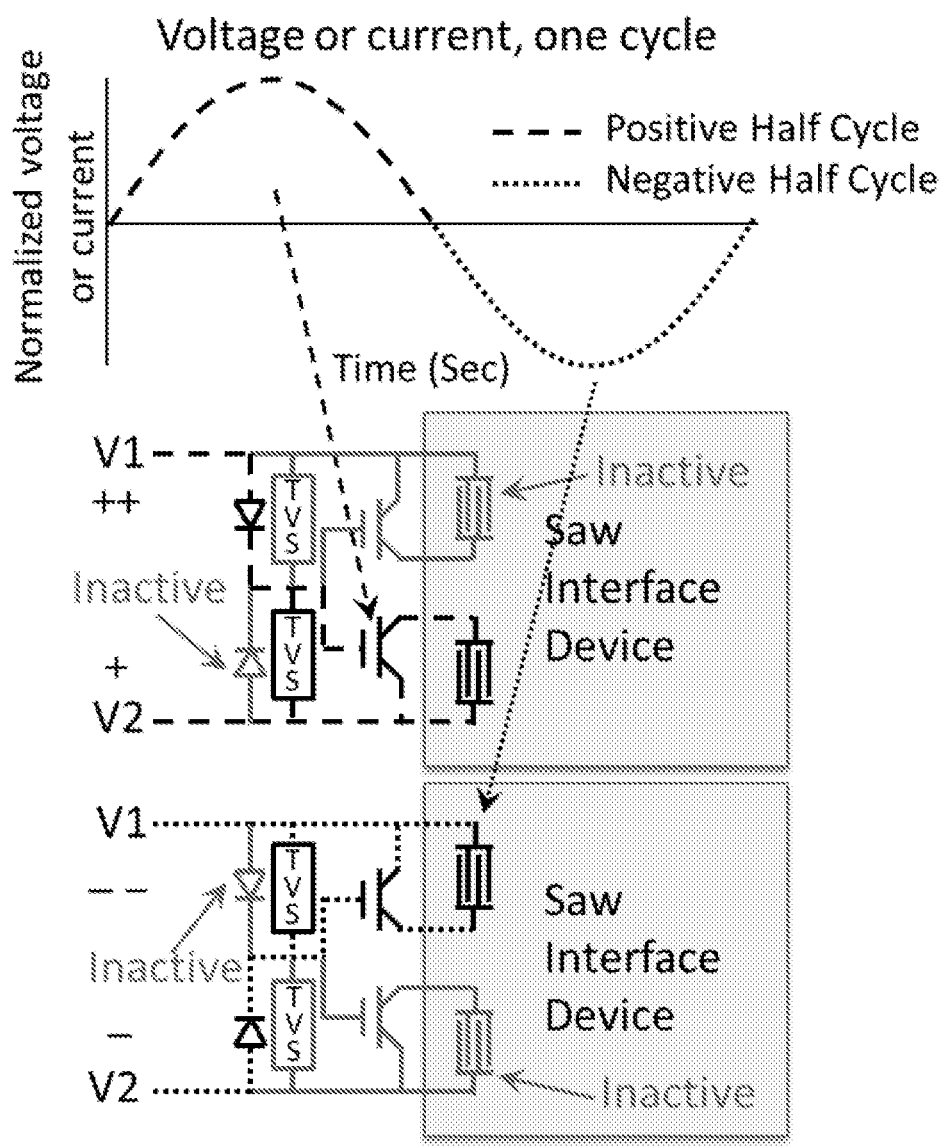
FIG. 15 shows a SAW wireless interface device configuration with multiple FETs and TVS devices for use in monitoring current (magnitude and direction) and voltage (magnitude and polarity) according to aspects of the present invention.

FIG. 15 shows a SAW wireless interface device configuration with multiple FETs and TVS devices for use in monitoring current (magnitude and direction) and voltage (magnitude and polarity) according to aspects of the present invention.

Figure 16:
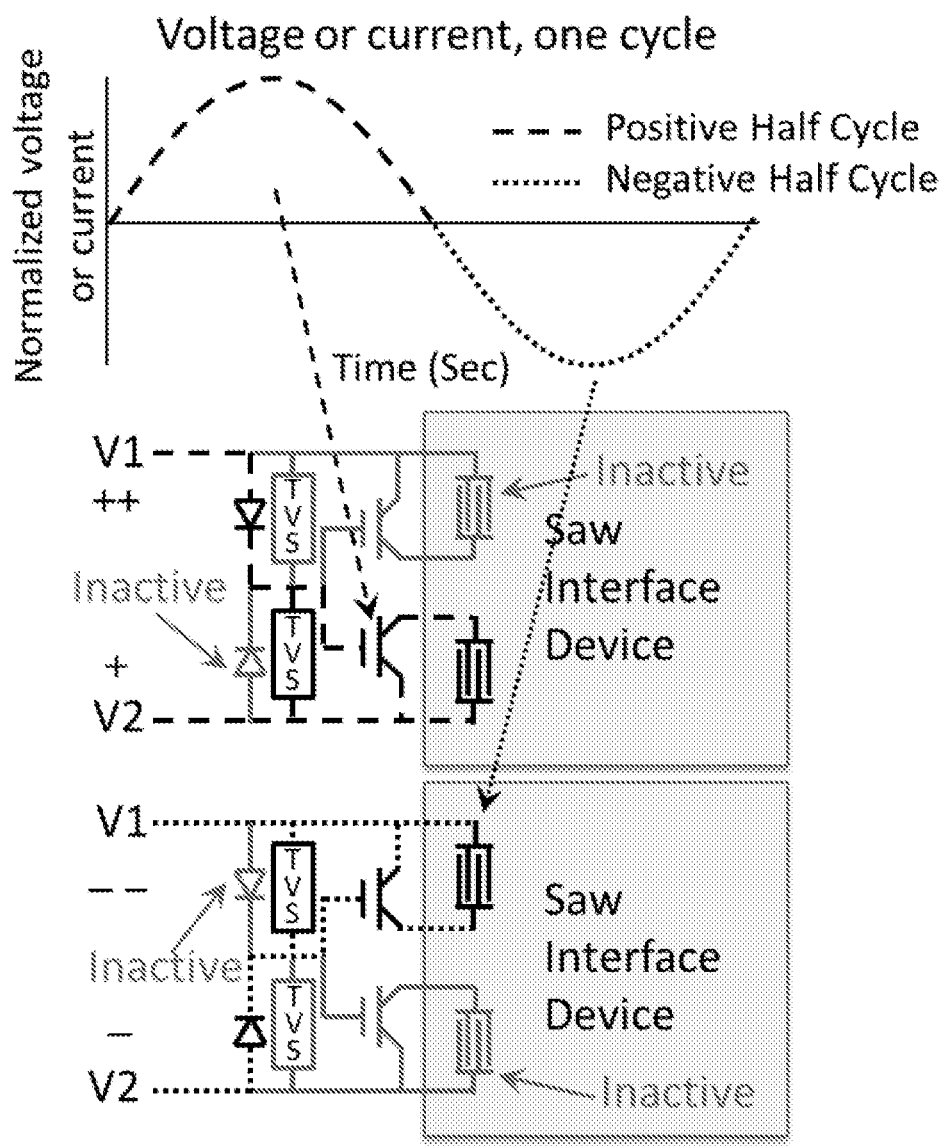
FIG. 16 shows a SAW wireless interface device configuration with multiple FETs and diodes for use in monitoring current (magnitude and direction) and voltage (magnitude and polarity) according to aspects of the present invention. This configuration includes common connections for the FET source nodes, whereas all prior embodiments included common FET gate nodes.

FIG. 16 shows a SAW wireless interface device configuration with multiple FETs and diodes for use in monitoring current (magnitude and direction) and voltage (magnitude and polarity) according to aspects of the present invention. This configuration includes common connections for the FET source nodes, whereas all prior embodiments included common FET gate nodes.

Figure 17:
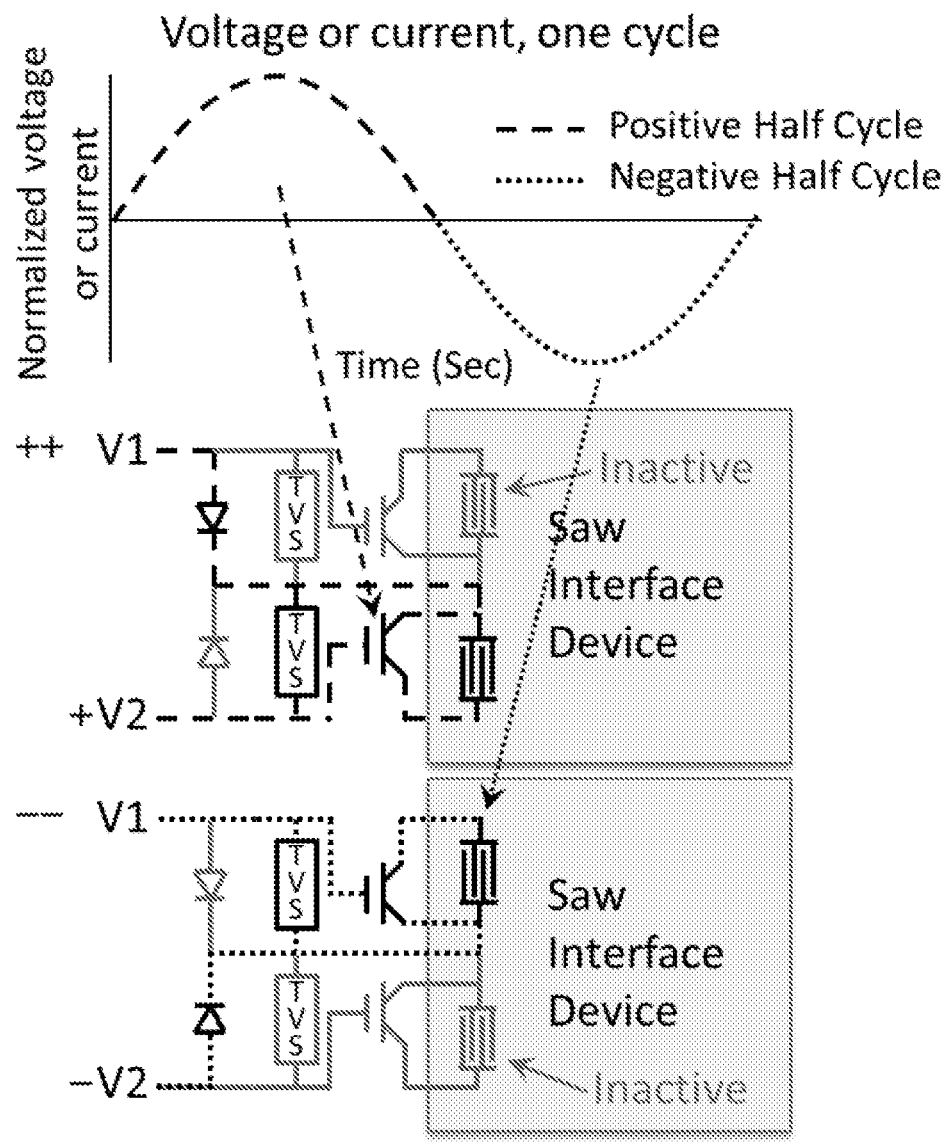
FIG. 17 shows a SAW wireless interface device configuration similar to that of FIG. 16, with the addition of transient voltage suppression (TVS) devices.

FIG. 17 shows a SAW wireless interface device configuration similar to that of FIG. 16, with the addition of transient voltage suppression (TVS) devices.

Figure 18:
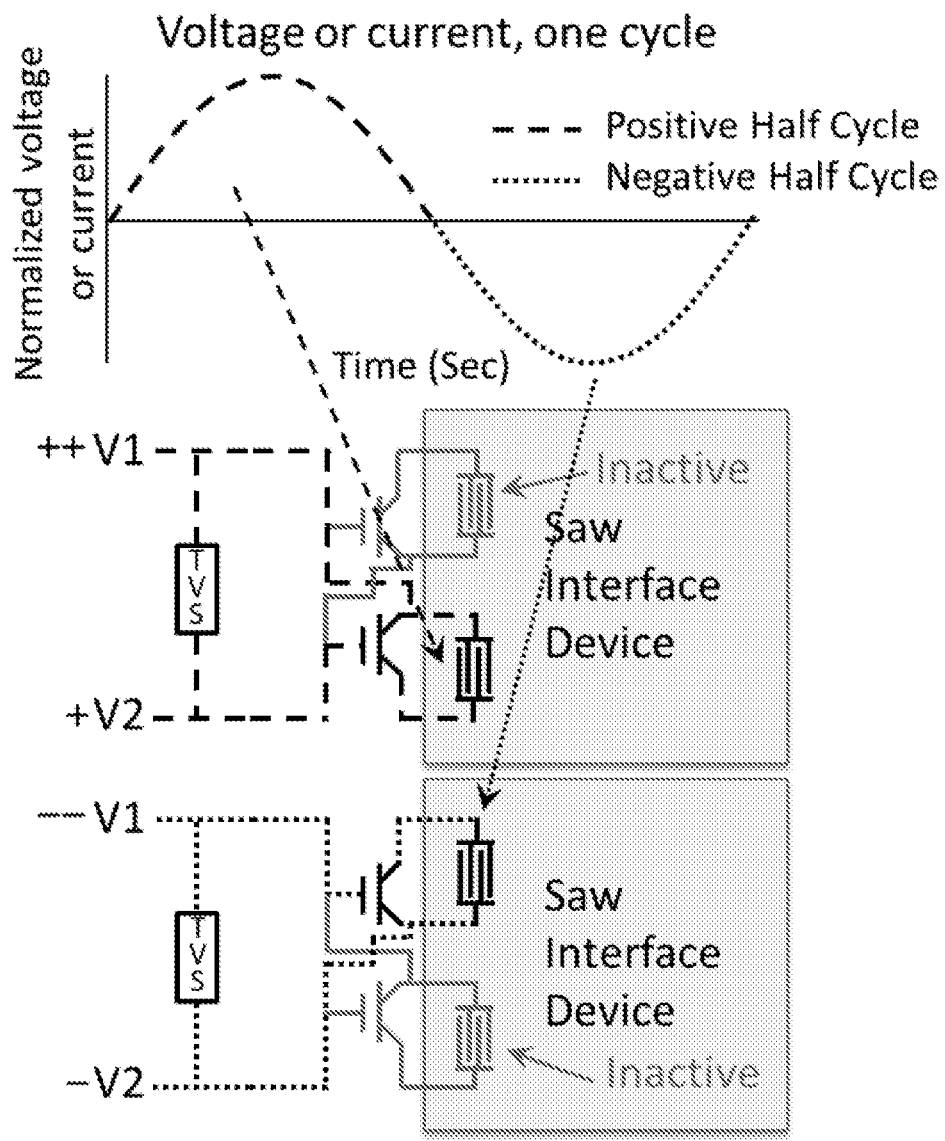
FIG. 18 shows an improved SAW wireless interface device configuration with multiple FETs for use in monitoring current (magnitude and direction) and voltage (magnitude and polarity) according to aspects of the present invention. In this embodiment, diodes external to the FETs are not utilized (other than TVS overvoltage protection device(s)), and the sources and drains of the two FETs are electrically isolated.

FIG. 18 shows an improved SAW wireless interface device configuration with multiple FETs for use in monitoring current (magnitude and direction) and voltage (magnitude and polarity) according to aspects of the present invention. In this embodiment, diodes external to the FETs are not utilized (other than TVS overvoltage protection device(s)), eliminating the dead zone issues like those shown in FIGS. 5, 6, and 15 through 17; and the sources and drains of the two FETs are electrically isolated, eliminating potential crosstalk between the acoustic channels that can be introduced in the embodiments of FIGS. 16 and 17.

Figure 19:
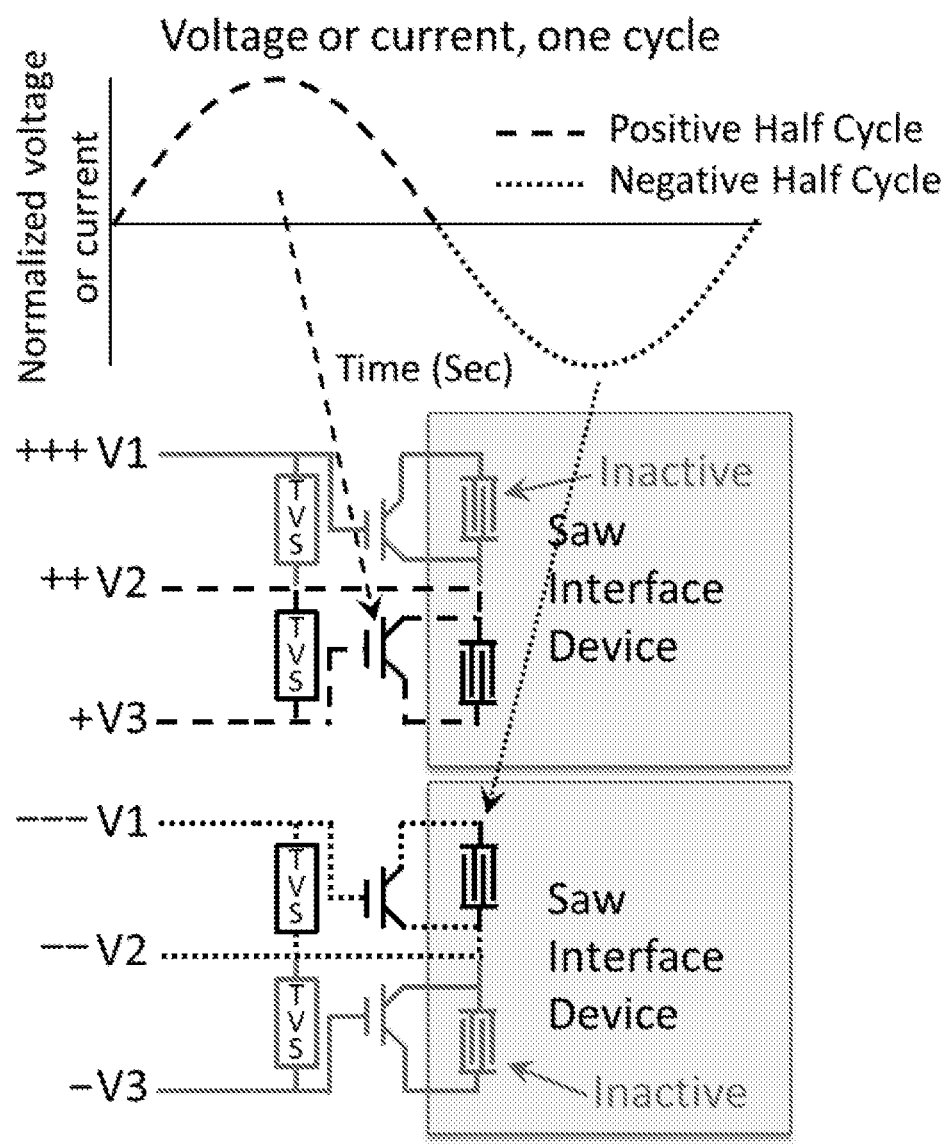
FIG. 19 shows another improved embodiment of a SAW wireless interface device configuration with multiple FETs for use in monitoring current (magnitude and direction) and voltage (magnitude and polarity) according to aspects of the present invention.

FIG. 19 shows an improved embodiment of a SAW wireless interface device configuration with multiple FETs for use in monitoring current (magnitude and direction) and voltage (magnitude and polarity) according to aspects of the present invention. TVS devices are included for suppression of transient voltages. In this embodiment, a common center field probe node feeds the sources of both FETs, while the FET gates are isolated and fed from two differential field probe voltages that share the aforementioned common node. No separate diodes are used in this embodiment, thus this embodiment does not exhibit the dead zone issues like those shown in FIGS. 5, 6, and 15 through 17. The combined circuit responds to both the positive and the negative half cycles of probe voltage at the same time, so readings can be taken from both—but depending on the FET characteristics, one part may exhibit larger responses preferentially during one half cycle. Which half cycle of the field probe activation voltage each portion of the SAW interface device responds to depends on the FET used. The characteristics of many FETs produce responses from the two acoustic channels that overlap slightly—with each FET responding primarily for one polarity of applied voltage, but responding for a small range of voltage beyond zero as well. Assessment of the response of both acoustic channels can provide better data on zero voltage crossings.

Figure 20:
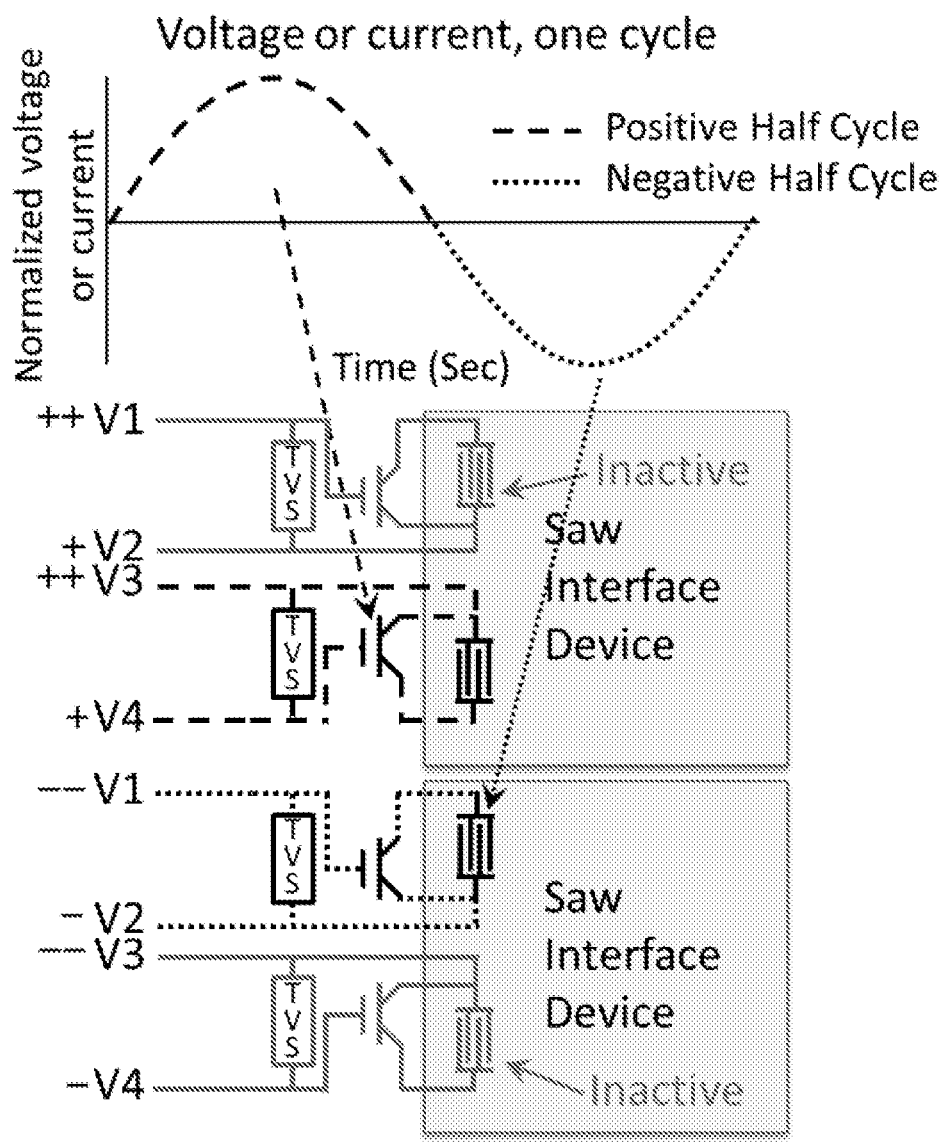
FIG. 20 shows yet another improved embodiment of a SAW wireless interface device configuration with multiple FETs for use in monitoring current (magnitude and direction) and voltage (magnitude and polarity) according to aspects of the present invention.

FIG. 20 shows yet another improved embodiment of a SAW wireless interface device configuration with multiple FETs for use in monitoring current (magnitude and direction) and voltage (magnitude and polarity) according to aspects of the present invention. TVS devices are included for suppression of transient voltages. In this embodiment, the sources of both FETs are electrically isolated from one another, with the FET sources and gates separately fed from two differential field probe voltages that do not share common electrical nodes. This configuration eliminates potential crosstalk between the acoustic channels that can be introduced by electrical nodes shared by FET sources and/or drains. As before, the combined circuit responds to both+ and—half cycles at the same time, so readings can be taken from both. Which half cycle each responds to depends on the FET used. Overlap can provide better zero crossings.

Figure 21:
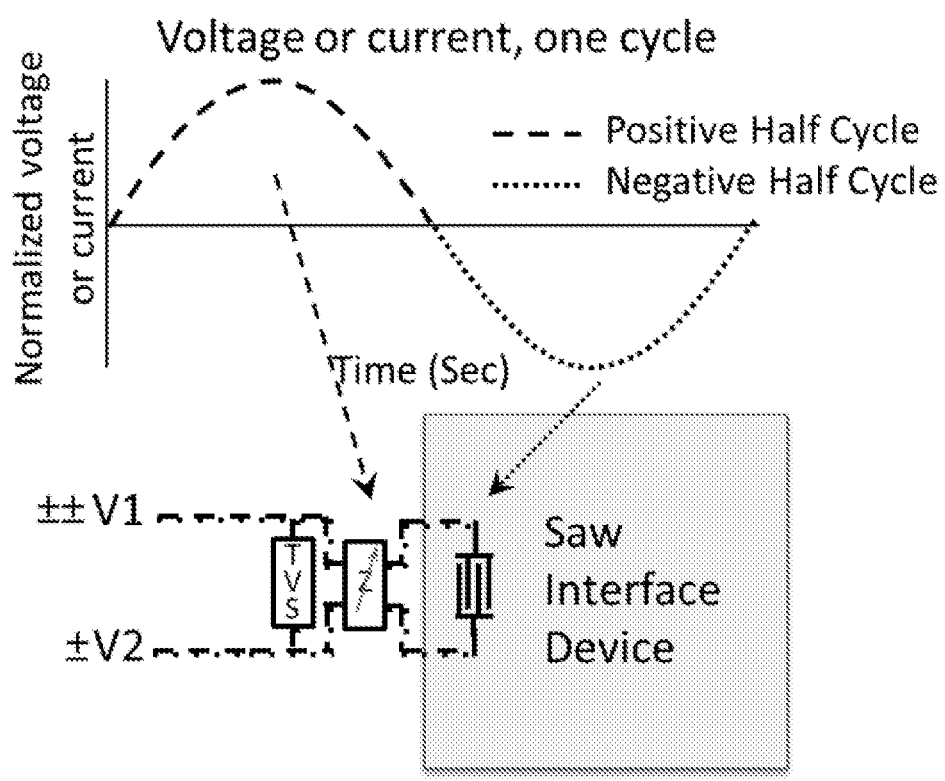
FIG. 21 shows a SAW wireless interface device configuration with a generalized voltage controlled variable impedance element for use in monitoring current (magnitude and direction) and voltage (magnitude and polarity) according to aspects of the present invention.

FIG. 21 shows a SAW wireless interface device configuration with a voltage controlled variable impedance element for use in monitoring current (magnitude and direction) and voltage (magnitude and polarity) according to aspects of the present invention. The voltage-controlled variable impedance element may be a voltage dependent resistor (VDR) or varistor, a device with a voltage controlled capacitance such as a varactor or varicap, a voltage controlled inductor, or in general any device that exhibits a complex impedance that changes with applied voltage. In order for this configuration to provide data that allows discernment of the polarity of the applied differential voltage, the voltage-dependent response must be non-symmetric around zero voltage. A TVS device may be included for circuit protection.

Figure 22:
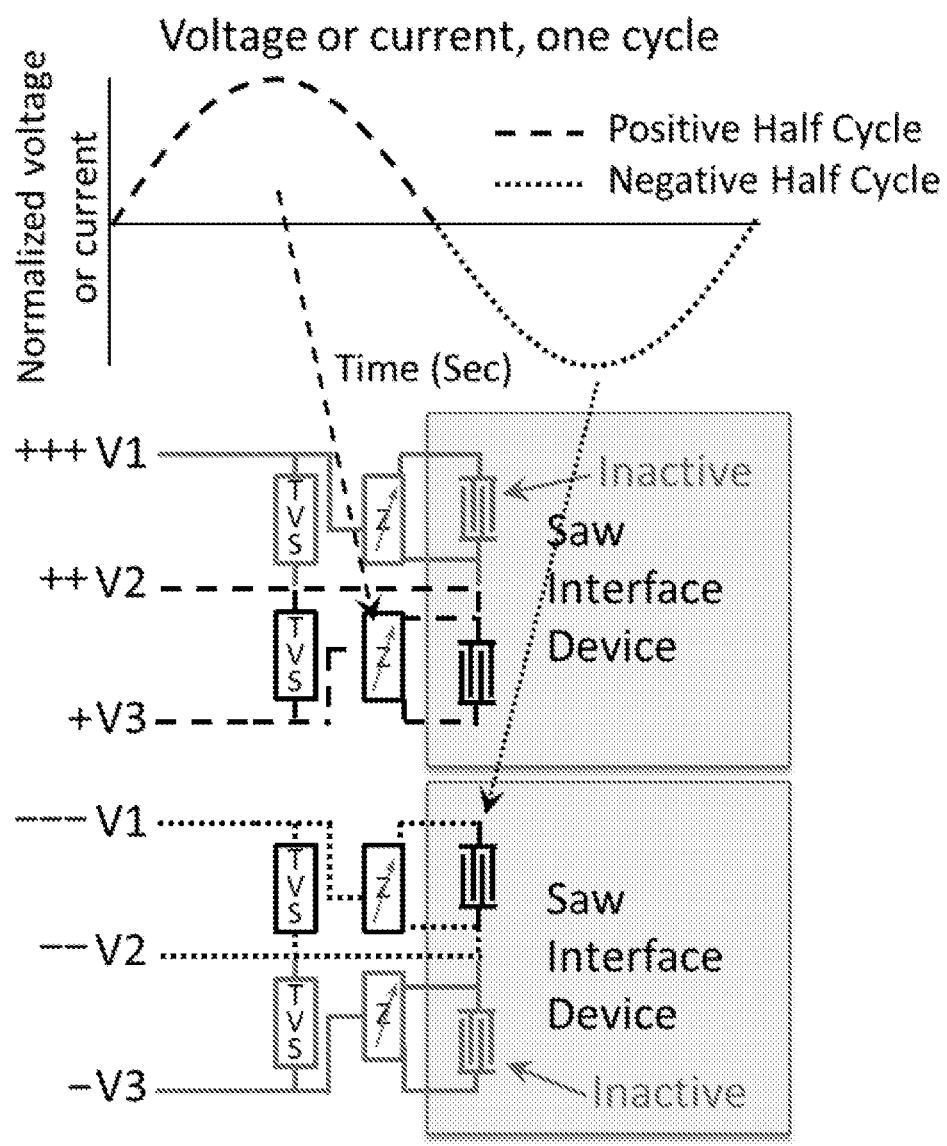
FIG. 22 shows a SAW wireless interface device configuration with a voltage controlled variable impedance element for use in monitoring current (magnitude and direction) and voltage (magnitude and polarity) according to aspects of the present invention. In this embodiment, a common center field probe node feeds one port of both variable impedance devices.

FIG. 22 shows a SAW wireless interface device configuration with a voltage controlled variable impedance element for use in monitoring current (magnitude and direction) and voltage (magnitude and polarity) according to aspects of the present invention. The voltage-controlled variable impedance element may be any device that exhibits a complex impedance that changes with applied voltage. TVS devices are included for suppression of transient voltages. In this embodiment, a common center field probe node feeds one port of both variable impedance devices. The combined circuit responds to both the positive and the negative half cycles of probe voltage at the same time, and assessment of the response of both acoustic channels can provide better data on zero voltage crossings.

Figure 23:
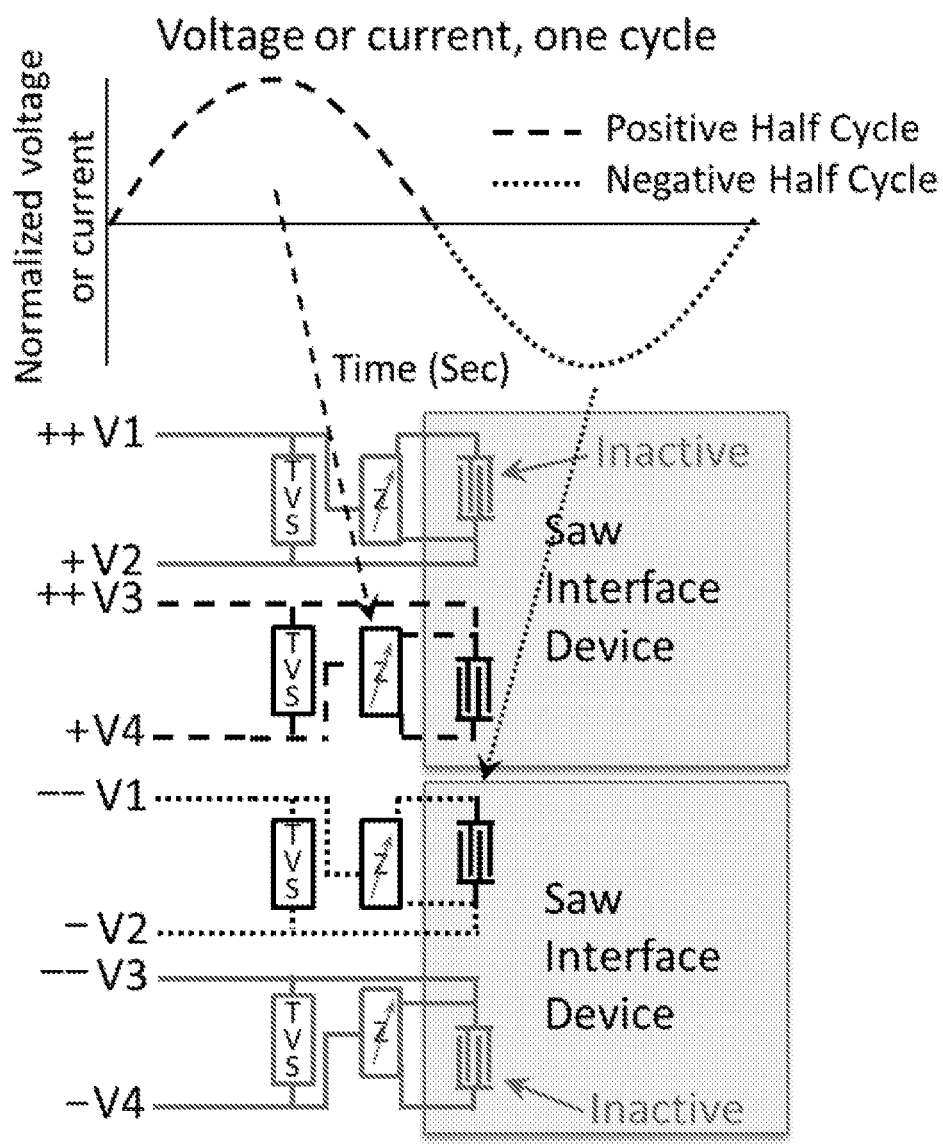
FIG. 23 shows a SAW wireless interface device configuration with a voltage controlled variable impedance element for use in monitoring current (magnitude and direction) and voltage (magnitude and polarity) according to aspects of the present invention. In this embodiment, the sources of both variable impedance devices are electrically isolated from one another, with inputs separately fed from two differential field probe voltages that do not share common electrical nodes.

FIG. 23 shows a SAW wireless interface device configuration with a voltage controlled variable impedance element for use in monitoring current (magnitude and direction) and voltage (magnitude and polarity) according to aspects of the present invention. The voltage-controlled variable impedance element may be any device that exhibits a complex impedance that changes with applied voltage. TVS devices are included for suppression of transient voltages. In this embodiment, the ports of both voltage variable devices are electrically isolated from one another, with the inputs separately fed from two differential field probe voltages that do not share common electrical nodes. This configuration eliminates potential crosstalk between the acoustic channels that can be introduced by electrical nodes shared by impedance element ports. As before, the combined circuit responds to both + and − half cycles at the same time, so readings can be taken from both. Which half cycle each responds to depends on the impedance element(s) used. Overlap can provide better zero crossings.

Figure 24:
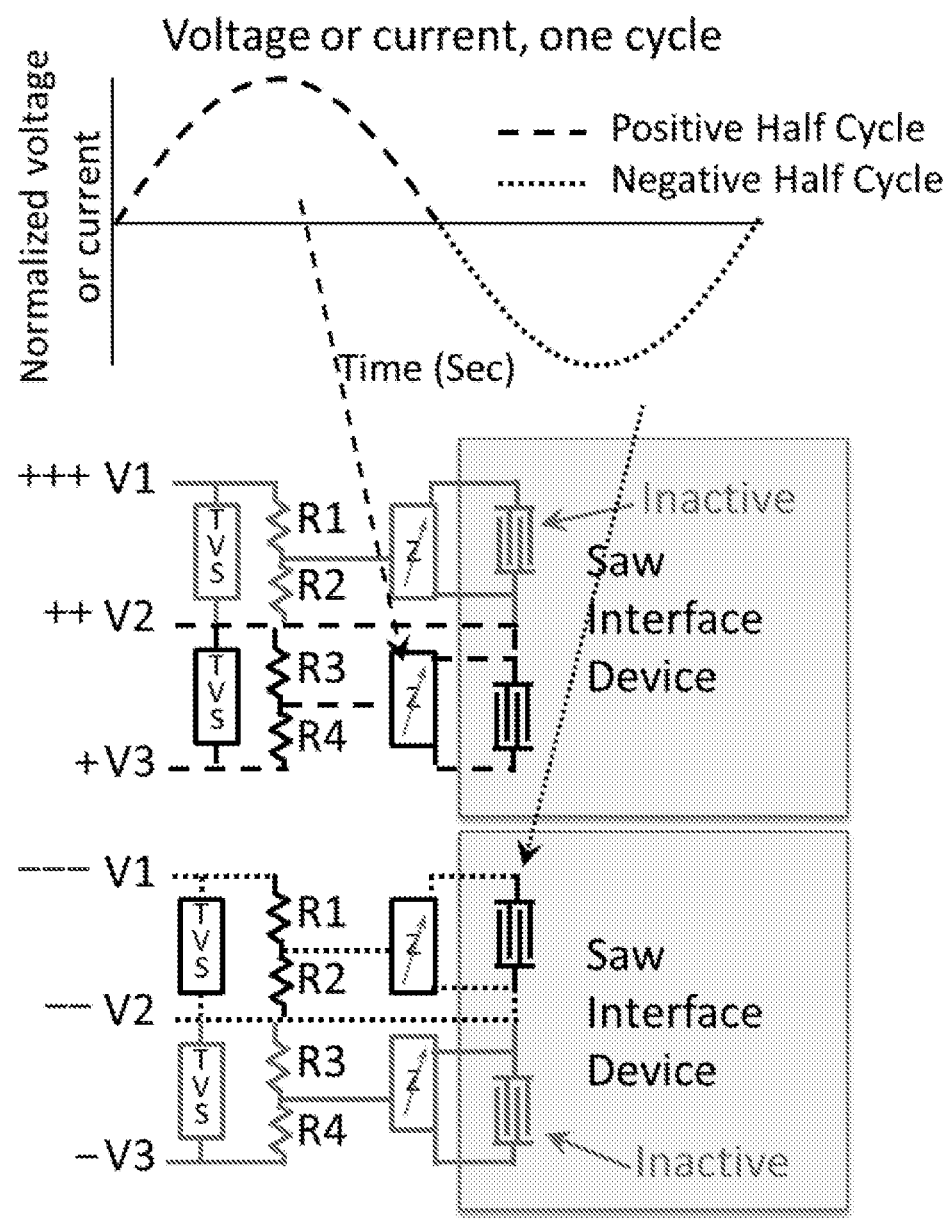
FIG. 24 shows a SAW wireless interface device configuration with a voltage controlled variable impedance element for use in monitoring current (magnitude and direction) and voltage (magnitude and polarity) according to aspects of the present invention that is similar to that in FIG. 22, but where resistive voltage dividers are used to reduce the field probe output voltages to desired levels for application to the voltage controlled variable impedance element control input(s).

FIG. 24 shows a SAW wireless interface device configuration with a voltage controlled variable impedance element for use in monitoring current (magnitude and direction) and voltage (magnitude and polarity) according to aspects of the present invention that is similar to that in FIG. 22, but where resistive voltage dividers are used to reduce the field probe output voltages to desired levels for application to the voltage controlled variable impedance element control input(s).

Figure 25:
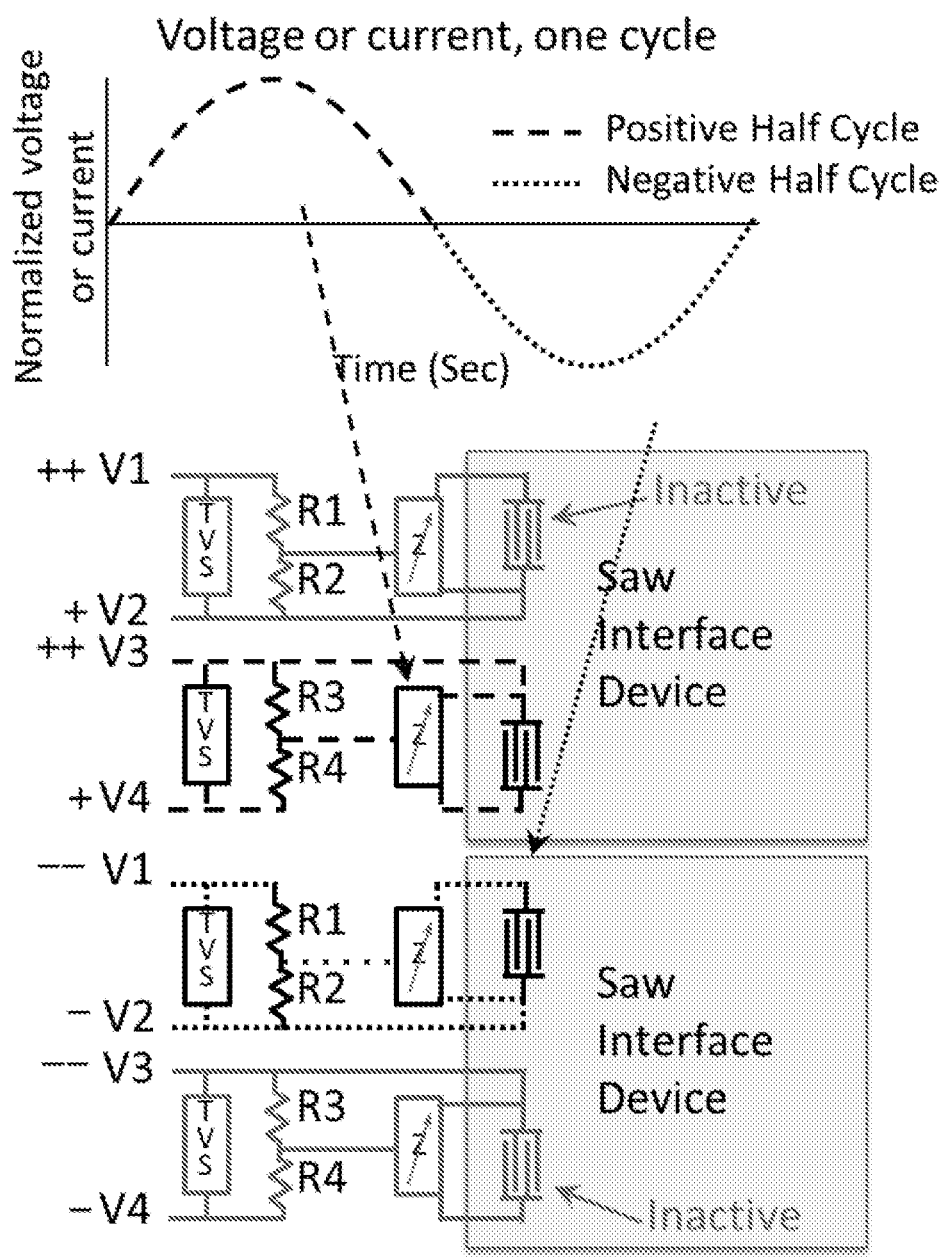
FIG. 25 shows a SAW wireless interface device configuration with a voltage controlled variable impedance element for use in monitoring current (magnitude and direction) and voltage (magnitude and polarity) according to aspects of the present invention that is similar to that in FIG. 23, but where resistive voltage dividers are used to reduce the field probe output voltages to desired levels for application to the voltage controlled variable impedance element control input(s).

FIG. 25 shows a SAW wireless interface device configuration with a voltage controlled variable impedance element for use in monitoring current (magnitude and direction) and voltage (magnitude and polarity) according to aspects of the present invention that is similar to that in FIG. 23, but where resistive voltage dividers are used to reduce the field probe output voltages to desired levels for application to the voltage controlled variable impedance element control input(s).

Magnetic Field Probes: Current transducer (CT) and Rogowski Coil (RC) devices are well known in the industry and are widely used to measure AC current by detecting and quantifying the magnetic field produced by time varying currents.

Conventional magnetic core current transducers (CTs) are well known in prior art. The output of conventional CT measurement systems is a voltage that is directly related to the instantaneous AC current I(t) in the conductor. Two-part CT current measurement solutions are also utilized when core saturation is to be avoided. In the two-part CT solution approach, a steel (or other material capable of focusing magnetic field) core is placed around the conductor in which current is to be measured. A primary coil is wrapped around the steel core, and short circuited (to maintain zero magnetic flux in the core). The current in the primary coil is measured using a secondary current transformer, which produces an output voltage. In the present invention, the output voltage of the secondary CT is applied to the FET gate or to the input of the voltage controlled variable impedance device.

Figure 26:
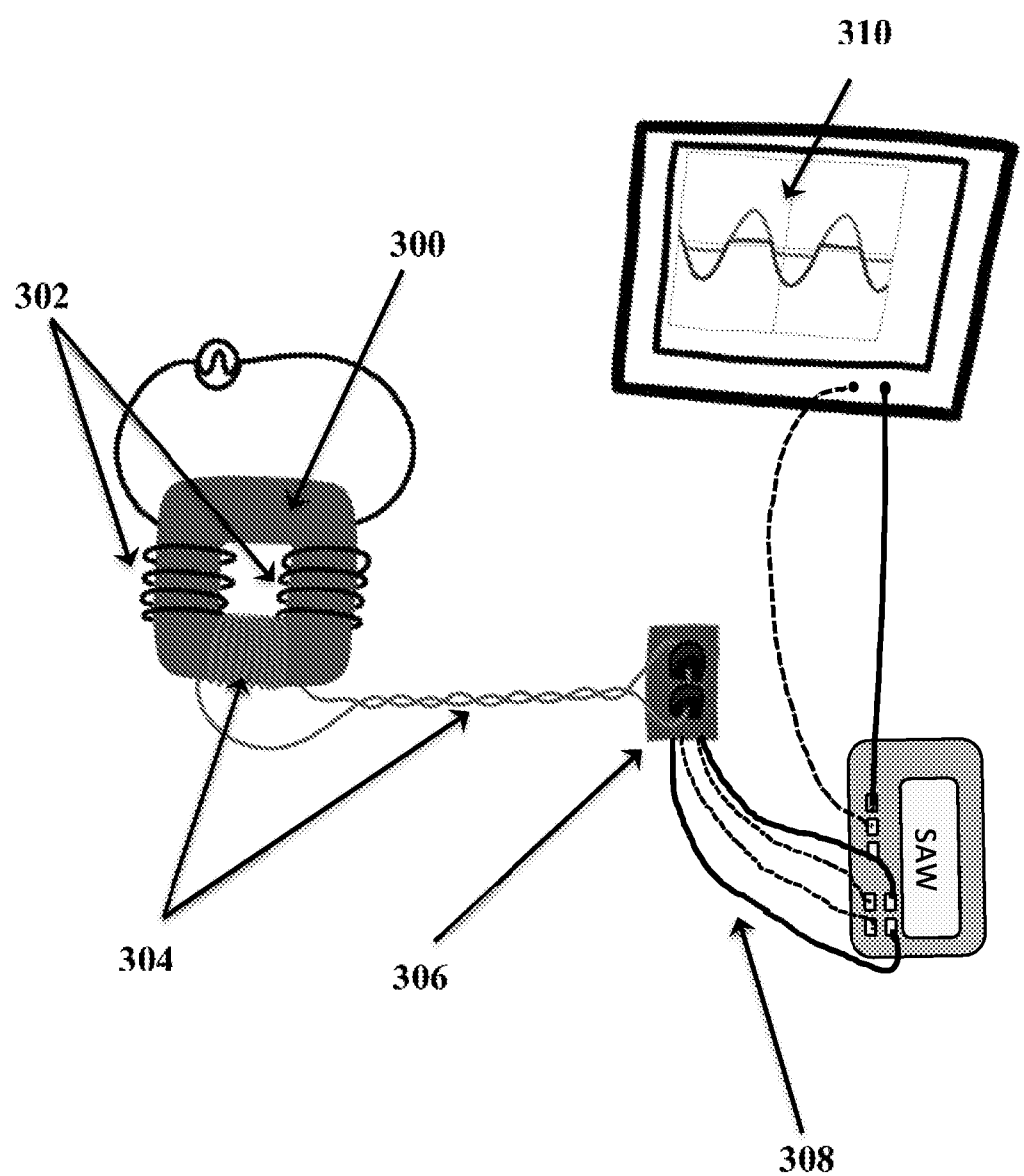
FIG. 26 shows a schematic representation of a two-part CT center tapped current measurement module according to aspects of the present invention.

FIG. 26 shows a schematic representation of a two-part CT center tapped current measurement module that outputs two differential voltages, according to aspects of the present invention. This current measurement module consists of a silicon steel core 300, wrapped in this example with 100 turns of #16 wire 304 as the primary CT. The primary drives a secondary CT 306. In FIG. 26, two secondary CTs 306 are used to measure the current in the primary. Ideally, the primary coil would be short circuited, allowing current to flow in the primary in response to changes in magnetic flux through the coil, producing opposing magnetic flux that cancels the change in flux that produced the current. Of course, the resistance of the primary winding prevents us from realizing this ideal situation. Core loss (energy removed from the field in the process of reorienting domains to align them to the external magnetic field) can reduce measurement accuracy at low field levels.

For testing, a Fluke 6100B current source delivered current into an 8-turn loop formed with about 6 feet of #6 AWG flexible welding wire 302 threaded through the primary CT core. The 8 turns effectively multiplied a $75A_{rms}$ drive from the Fluke to a full-scale $600A_{rms}$ going through the core. One embodiment of the 2-part CT solution according to aspects of the present invention is shown in the schematic representation of FIG. 26, where two secondary CTs 306 have been arranged to produce complementary differential output voltages through connections 308. In the present invention, the output differential voltages of the secondary CTs are applied to the inputs of the FETs or other voltage controlled variable impedance devices used. The resulting waveforms 310 are shown on the oscilloscope in this figure, where we see two sinusoidal traces that are 180° out of phase, with each waveform clipped at a set level due to diode-like effects in the FET. This clipping effect is what allows us to distinguish the positive portion of the line current (or voltage for the E-field probe) waveform from the negative portion of the waveform, thereby enabling us to accurately determine phase.

An alternative method for measuring current via detection of magnetic field is the Rogowski coil. Rogowski coils have a number of benefits for power line monitoring, notably that the current measurement becomes insensitive to variations in the position of the power line surrounded by the coil, making system performance robust to variations due to small installation differences. Even with a stationary power line, the current density within the line can vary over time as large metal objects (such as trains or large trucks) move nearby. This meandering of current density would not be an issue for the Rogowski coil structure, however. As the current moves towards one side of the coil, the impact of the current on the far side of the coil decreases proportionally, keeping the measured total the same. A simple magnetic field sensing coil would be sensitive to the same current density movements, causing errors in the measured current.

Rogowski coils operate by detecting time varying magnetic flux passing through the turns of the coil, and the voltage produced at the output is proportional to the time derivative of current (dI(t)/dt). Integration to produce the instantaneous current I(t) can be performed digitally on sampled data, or using analog circuitry at the coil output. According to the present invention, we use the Rogowski coil output voltage to modulate the drain to source impedance of a FET connected to out SAW sensor-tags (or as an input to another type of voltage-controlled variable impedance device). Integration can be performed by proper Rogowski coil electrical termination to produce an output voltage proportional to I(t), or voltages proportional to dI(t)/dt can be used and can then the resulting data can be integrated digitally in the receiver after sampled data has been obtained.

Figure 27:
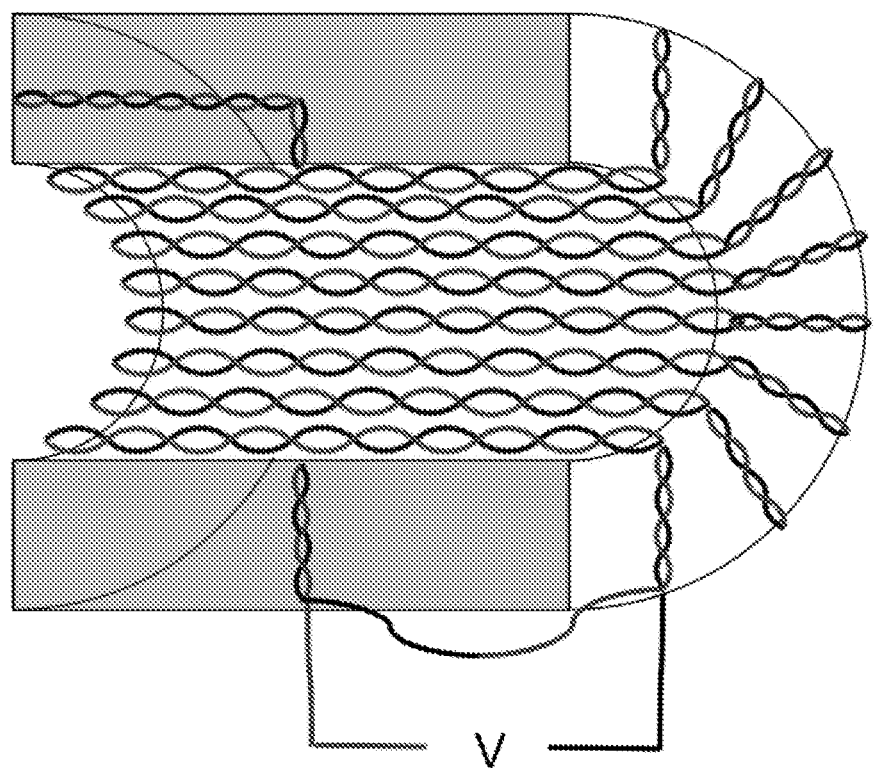
FIG. 27 shows one half of one Rogowski coil toroidal section according to aspects of the present invention, with twisted wire windings and a return through the center of the toroid.
Figure 28:
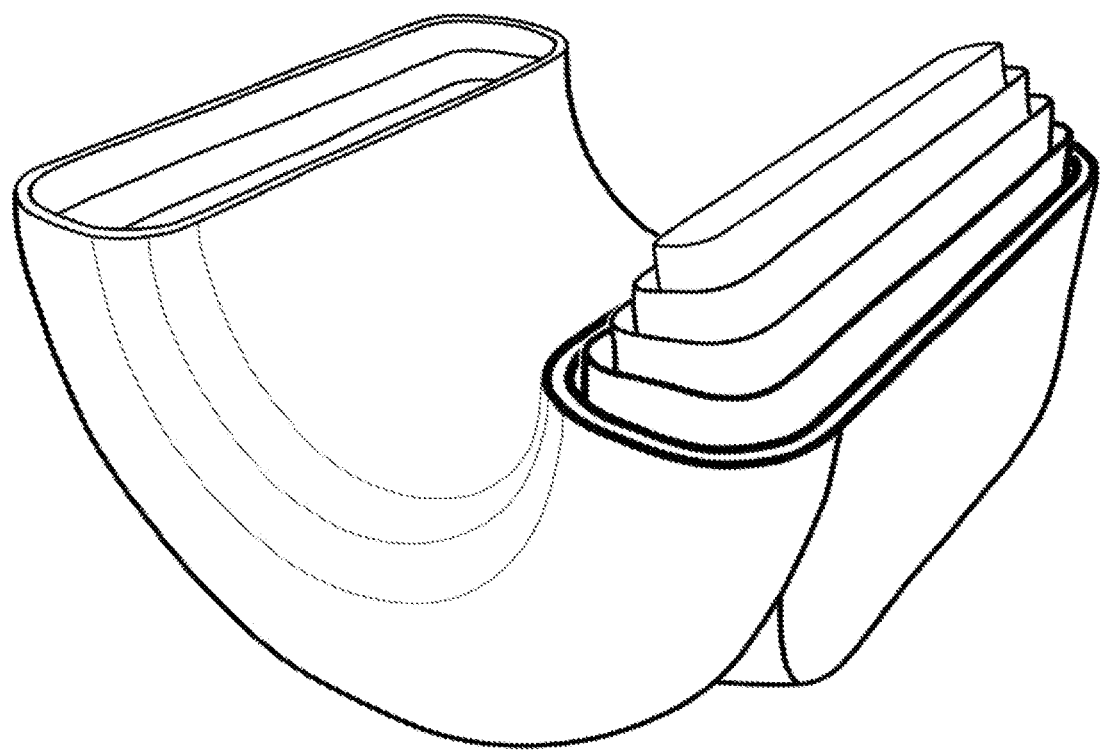
FIG. 28 shows a set of nested toroids that comprises the supports on which wire windings can be wound to form one half of a high-output Rogowski coil.

Commercially available Rogowski coils produce very low output voltages, in the range of 20 µV/A to 1400 µV/A. In order to produce voltages sufficient to modulate the FET D-S impedance as desired over the current range to be measured (which may in one example be zero to 600 $A_{rms}$), we need our Rogowski coil to output voltages that are roughly two orders of magnitude larger. The present invention teaches a novel, high output voltage Rogowski coil that consists of two sets of semi-circular nested toroids, each of which is wrapped with coils of magnet wire (or twisted pair wires), with the return wire fed down the center of each toroid. The coil is formed in two sections to allow assembly around a power line. The cross-sectional area of each side of the toroid is roughly rectangular, with corners that are rounded (nominally as quarter-circles). Use of twisted wire windings can produce an output that cancels the effects of external fields captured by the coil. FIG. 27 shows one half of one Rogowski coil toroidal section according to aspects of the present invention, with twisted wire windings and a return through the center of the toroid. FIG. 28 shows a set of nested toroids that comprises the supports on which wire windings will be wound to form one half of a high-output Rogowski coil. Nested toroids can be used to produce Rogowski coils with output voltages on the order of 10 mV/A or more. According to another aspect of the present invention, center tapping of the coils can produce a differential output voltage that can drive two voltage controlled variable impedance devices attached to SAW transducers.

Figure 29:
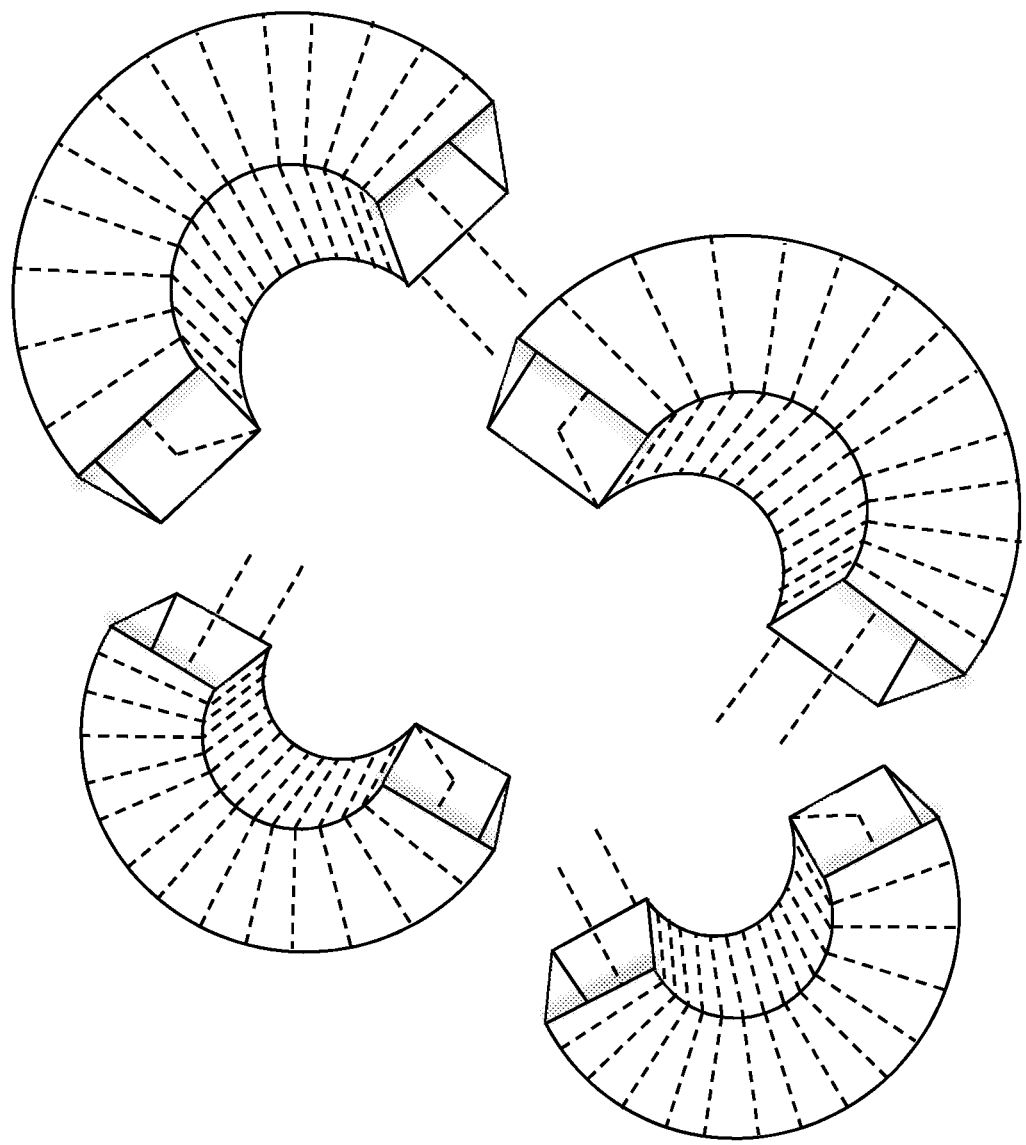
FIG. 29 shows a schematic representation of a two-toroid, nested Rogowski coil fabricated using 3D printing to produce the toroid components.

FIG. 29 shows a schematic representation of a two-toroid, nested Rogowski coil fabricated using 3D printing to produce the toroid components. The toroids were produced in halves, to allow the coil to be installed around a high voltage line, and each half was wrapped with magnet wire, with the return wire passed down through the middle of the core. Once wrapped, the half-toroid sections were covered with Kapton tape for mechanical protection, being sure not to disturb the carefully arranged windings. The wire-wrapped half-toroids, prior to application of Kapton tape, were mechanically fairly fragile and hard to handle for testing. After the protective tape layer had been applied, the smaller half-toroids were nested inside the larger ones, while routing the return wires down the center. Small strips of foam insulation were used to wedge the smaller half-toroids inside the larger ones to prevent relative movement. For mechanical stability, these parts can be potted. The return wires were gathered into one location for each half-toroid, and all but two for each half were connected appropriately to cause the voltage produced from each shell to add. To verify these connections were correct, a current carrying test cable was held in the center of each half-toroid in order to measure the output voltage. If the connections were backwards, as was the case initially for one half-toroid, we would observe the difference of the designed output voltages of the two sections rather than the sum, and we then corrected the connection to obtain the desired output. The two halves were then electrically connected together to form a center tapped differential voltage output according to aspects of the present invention, that could be used to feed our two-FET SAW measurement module.

Figure 30:
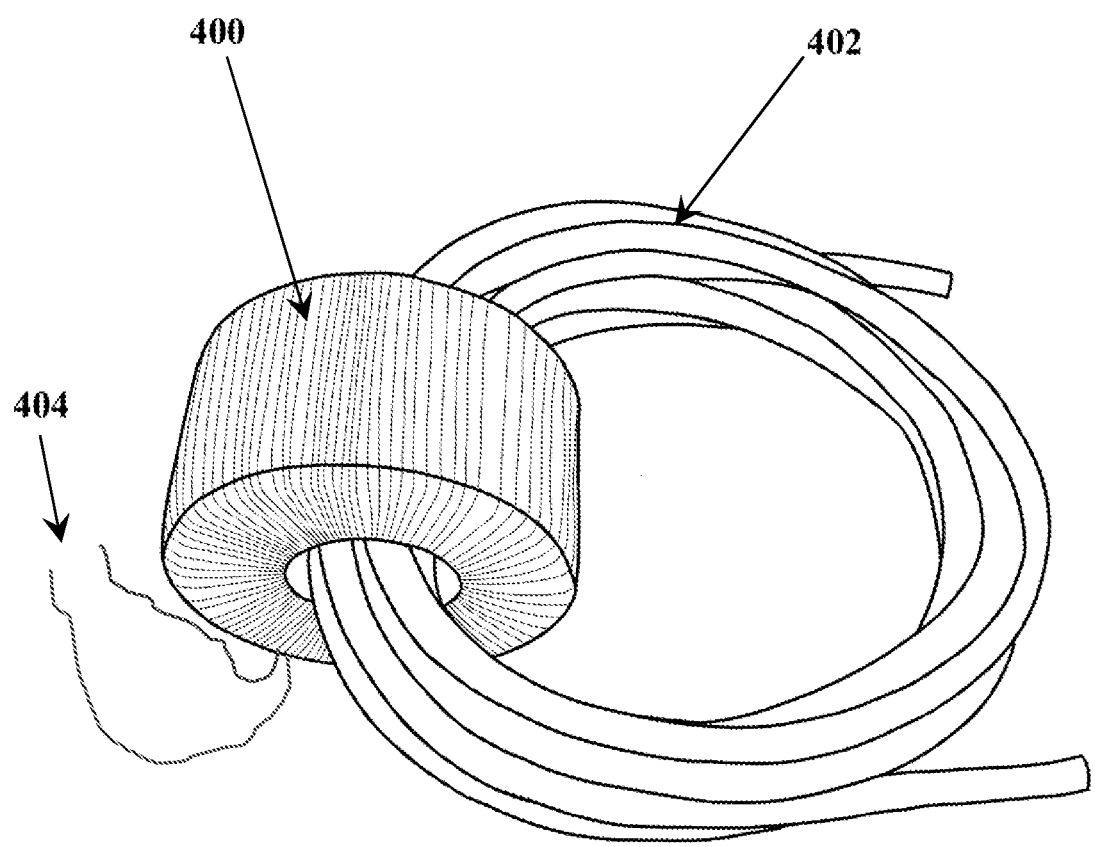
FIG. 30 shows a schematic representation of the complete two nested toroid assembled coil, placed around an 8-turn exciting loop of wire that can be used to generate current for testing.

FIG. 30 shows a schematic representation of the complete two nested toroid assembled coil 400, placed around an 8-turn exciting loop 402 made from an 8" diameter loop of flexible #2 AWG welding wire. The fine coil wires used to make external electrical connections 404 can be seen on the left in FIG. 30 for connection to the SAW/FET module. Testing this coil yielded an overall transfer function of 12.18 mV/$A_{rms}$ at 60 Hz.

While the Rogowski coil has the inherent benefits of being able to measure very low currents more accurately (it experiences no core loss as seen in the CT solution) and not suffering from saturation at high current levels, the mechanical fragility of the large, nested toroid coil shown in FIG. 30 would need to be addressed through manufacturing engineering. Such a device could according to aspects of the present invention be made using PCB-like or ceramic materials as substrates for printed traces, replacing the fragile fine wires of the coil shown in FIG. 30 with more robust structures.

The SAW devices described in the present invention can be used either as wireless interface devices to field probes, or as direct sensors to measure electric field (as described above) or as magnetic field sensors (through incorporation of magnetostrictive films and other methods). SAW wireless interface devices could also be used to wirelessly read other electric and magnetic field sensors other than the field probes described herein, without diverging from the intent and scope of the present invention.

According to aspects of the present invention, the SAW sensors or sensor-tags utilized as wireless interface devices to field probes or field sensors (or as direct electric field or magnetic field sensors) can also be utilized to monitor the temperature of the current carrying conductor. Also within the scope of the present invention, ancillary temperature measurement devices, which may include thermistors, RTDs, and similar devices that have impedances that vary with temperature, can be read wirelessly via the SAW sensor-tags.

The present invention also teaches intelligent power line monitoring devices, systems, and apparatuses and methods incorporating the devices, apparatuses and methods described herein. Local data processing in the radio that interrogates the line mounted units can analyze and interpret data locally to determine if operating power line conditions are within normal operating ranges, or if the line is undergoing excursions that are outside of normal operating conditions. This intelligent power line monitoring system can provides near real-time actionable intelligence on line condition to utility control and monitoring systems. What constitutes normal operating conditions can be defined by specific utilities, and protocols for establishing alert levels and data logging can be customized in software and firmware within the local radio.

The illustrations included herein are exemplary in nature, and do not encompass all aspects of the present invention. One skilled in the art would recognize that the improvements provided by embodiments of this invention can be implemented using a variety of voltage controlled variable impedance devices, a range of circuit configurations, and a large number of potential variations in electric field and magnetic field probes and transient voltage suppression devices. Various radio architectures, including software defined radios, can be used to implement power line monitoring systems according to the present invention. The examples provided in this specification are not all-inclusive, and other implementations that would be apparent to one skilled in the art should be considered within the scope of the present invention.

One skilled in the art would also recognize that the improvements provided by embodiments of this invention can be implemented to work with any of a wide range of known SAW sensor and sensor-tag structures, including but not limited to those incorporating various diversity techniques (code, chirp, time, and frequency diversity among others). A wide range of known coding techniques can be implemented in combination with the embodiments described. It would be understood by one versed in the art that simple on-off keying, phase modulation, pulse position modulation, and many other techniques could be used with the techniques described herein to enhance the number of codes that work together without interference. Frequency diversity, code diversity, time diversity, and other known techniques can be combined to achieve sets of devices with desirable properties. Any of these techniques could be utilized in the aforementioned device embodiments to increase the number of sensors that can work together in a system. Devices utilizing such structures could also be useful for RFID tag and sensor-tag applications, where identification of individual devices is desired. In addition, combinations of these techniques may be advantageous in certain circumstances.

Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. An apparatus for wirelessly measuring the strength of electric fields around conductors, comprising:
   one or more acoustic wave sensor or sensor-tag devices; and
   at least one device with a voltage-controlled variable electrical impedance that is physically separate from but electrically connected to the one or more acoustic wave sensor or sensor-tag devices for loading the one or more acoustic wave sensor or sensor-tag devices; and
   at least one differential electric field probe operable to interact with the electric field being measured and produce a voltage for driving the at least one device with the voltage-controlled variable electrical impedance;
   wherein the at least one differential electric field probe comprises:
      one first cylindrical conductive section with a first interior radius;
      at least one second cylindrical conductive section with a second interior radius that is not equal to said first interior radius; and
      an inner third cylindrical conductive section;
      wherein the first, the at least second, and inner third cylindrical conductive sections are positioned around a common longitudinal axis,
      wherein the common longitudinal axis is parallel to the length of a conductor that passes through the interior of the inner third cylindrical conductive section,
      wherein both of the first and the at least one second cylindrical conductive sections are electrically isolated from the conductor and electrically isolated from the inner third cylindrical conductive section, and
      wherein the first cylindrical conductive section is electrically isolated from the at least one second cylindrical conductive section, and
      wherein a differential voltage is produced between each pair of the cylindrical conductive sections,
      wherein the apparatus includes a support structure configured to close around the conductor, mechanically support all parts of the apparatus and mechanically connect the apparatus to the conductor, the support structure comprises a conductive portion,
      wherein the conductive portion of the support structure is in electrical contact with the inner third cylindrical conductive section,
      wherein an inner radius of the smallest of the first and the at least one second cylindrical conductive sections is larger than an outer radius of the third inner cylindrical conductive section electrically connected to the support structure,
      wherein the third inner cylindrical conductive section has a length along the conductor that is at least as long as the length of the first and the at least one of second cylindrical conductive sections, and
      wherein the third inner cylindrical conductive section comprises an equipotential cylinder that provides a reference potential (voltage) based on the electrical potential (voltage) of the conductor that passes through the interior of the cylindrical conductive sections, with respect to which differential voltages of the other cylindrical conductive sections are measured;
   one or more transient voltage suppression devices; and
   one or more antennas.

2. The apparatus of claim 1, further comprising:
   at least one second field probe operable to interact with the magnetic field being measured and produce a voltage for driving the at least one device with the voltage-controlled variable electrical impedance.

3. The apparatus of claim 2, wherein the at least one second field probe incorporates at least one Rogowski coil.

4. The apparatus of claim 2, wherein the at least one second field probe incorporates at least one current transducer.

5. A system for wirelessly measuring current and voltage on a conductor carrying an AC voltage comprising:
   at least one apparatus of claim 2, and
   wherein the at least one apparatus of claim 2 is interrogated by one or more wireless readers.

6. A system for wirelessly measuring the current and voltage on a conductor carrying an AC voltage and the temperature of said conductor, the system comprising
   the system of claim 5; and further comprising
   at least one apparatus for wirelessly measuring the temperature of said conductor.

7. The system of claim 5, further comprising resistive dividers electrically connected across the output of at least one of the field probes, the resistive dividers configured to provide at least one reduced voltage that depends on the strength of the field being measured, and to drive the at least one voltage-controlled variable impedance device.

8. The system of claim 5, further comprising general complex impedance based dividers electrically connected across the output of at least one of the field probes, the general complex impedance based dividers configured to provide at least one reduced voltage that depends on the strength of the field being measured, and to drive the at least one voltage-controlled variable impedance device.

9. The system of claim 5, further comprising:
two or more transient voltage suppression (TVS) that cause voltages above a defined level to be shunted through said protective device;
wherein at least one of the protective devices is mounted between each pair of electrical nodes in the system that feed the voltage-controlled variable impedance device,
wherein at least one of the protective devices is mounted between a hot connection and a virtual ground connection of the at least one antenna,
wherein at least one of the protective devices is mounted across the differential output of each field probe,
wherein at least one of the protective devices is mounted between a SAW device ground plane, which is at the reference potential provided by the inner third conductive cylinder, and a virtual ground plane of the at least one antenna, and
wherein additional protective devices are mounted between each pair of electrical nodes in the system that feed other system components that are damaged by overvoltage conditions.

10. The system of claim 5, further comprising:
electrical connections between the one or more acoustic wave sensor or sensor-tag devices and other components, the other components including at least two of the voltage-controlled variable impedance devices, the at least one electric field probe, the at least one magnetic field probe, and the at least one antenna;
wherein each of the at least two voltage-controlled variable impedance devices is electrically attached to one acoustic wave reflector element within the one shared acoustic wave device,
wherein each connected device forms a pair of electrical nodes, and
wherein the electrical connections are configured to avoid electrical nodes in the system that are common to multiple reflector elements in the one or more acoustic wave sensors or sensor-tag devices.

11. The apparatus of claim 2;
wherein the at least one differential electric field probe further comprises at least two differential electric field probes, each with at least two outer concentric cylindrical conductive sections of different radii that are larger than the inner third cylindrical conductive section,
wherein the two outer concentric cylindrical conductive sections of each of the at least two differential electric field probes are each electrically isolated from each other and from the inner third cylindrical conductive section,
wherein the two outer concentric cylindrical conductive sections of each of the at least two differential electric field probes are each electrically isolated from the two outer concentric cylindrical conductive sections of each other of the at least two differential electric field probes,
wherein the at least two differential electric field probes are either side-by-side or spaced out along the longitudinal axis of the apparatus, and
wherein at least two differential voltages that provide a measure of the electric field strength are produced from the at least two differential electric field probes.

12. The apparatus of claim 1,
wherein the first cylindrical conductive section, the at least one second cylindrical conductive section, and the inner third cylindrical conductive section are made up of multiple pieces that enable the apparatus to be opened for installation around the conductor, be closed to both mechanically affix the apparatus to the conductor, and provide direct or indirect electrical contact between the multiple pieces that make up each of the first and the at least one second cylindrical sections, and
wherein the multiple sections include an upper portion and a lower portion.

13. The apparatus of claim 12,
wherein the upper and lower portions of the first and the at least one second cylindrical conductive sections are offset from one another along the length of the conductor;
wherein the inner third cylindrical conductive section extends a full length of at least one of the first and the at least second cylindrical conductive sections; and
wherein the upper and lower portions of each of the conductive sections are in direct or indirect electrical contact.

14. The apparatus of claim 6,
wherein the first and the at least one second cylindrical conductive sections have lengths along the axis of the conductor that are small enough to produce circular conductive sections, and
wherein said circular conductive sections can be co-located or spaced out along the length of said conductor.

15. A system for wirelessly measuring the strength of electric fields comprising:
one or more apparatuses of claim 1; and
at least one wireless reader operable to activate and gather data from the one or more apparatuses.

16. The apparatus of claim 1,
wherein the third inner cylindrical conductive section comprises an equipotential cylinder that provides a reference potential (voltage) equal to the electrical potential (voltage) of an uninsulated conductor that passes through the interior of said cylindrical conductive sections, with respect to which differential voltages of the other cylindrical conductive sections are measured.

17. The apparatus of claim 6,
wherein the third inner cylindrical conductive section comprises an equipotential cylinder that provides a reference potential (voltage) equal to the electrical potential (voltage) at the outer surface of the insulation of an insulated conductor that passes through the interior of said cylindrical conductive sections, with respect to which differential voltages of the other cylindrical conductive sections are measured.

18. An apparatus for wirelessly measuring electric and magnetic fields strengths around a current carrying conductor and temperature of an outer surface of the current carrying conductor, the apparatus comprising:
one or more acoustic wave sensor or sensor-tag devices;
wherein one or more acoustic wave sensor or sensor-tag devices is configured to measure temperature; and
at least two devices with voltage-controlled variable electrical impedance that are physically separate from but electrically connected to the one or more acoustic wave sensor or sensor-tag devices for loading the one or more acoustic wave sensor or sensor-tag devices; and
at least one magnetic field probe configured to interact with the magnetic field being measured and produce a voltage for driving at least one of the at least two devices with voltage-controlled variable electrical impedance; and at least one differential electric field probe configured to interact with the electric field being measured and produce a voltage for driving at least one of the at least two devices with voltage-controlled variable electrical impedance;

wherein the differential electric field probe comprises:
- a first cylindrical conductive section with a first interior radius;
- at least one second cylindrical conductive section with a second interior radius that is not equal to the first interior radius; and
- an inner third cylindrical conductive section;
- wherein the first, the at least one second, and the third cylindrical conductive sections are positioned around a common longitudinal axis, the common longitudinal axis is parallel to the length of a conductor,
- wherein the conductor passes through an interior of the inner third cylindrical conductive section,
- wherein the first and the at least one second cylindrical conductive sections are electrically isolated from the conductor and electrically isolated from the inner third cylindrical conductive section,
- wherein the first cylindrical conductive section is electrically isolated from the second cylindrical conductive section,
- wherein a space between the first and the second cylindrical conductive section is filled with a dielectric,
- wherein a differential voltage that provides a measure of the electrical field strength is produced between each pair of the cylindrical conductive sections,
- wherein the apparatus includes a support structure that can be closed around the conductor, and configured to mechanically support all parts of the apparatus and connect the apparatus to the conductor,
- wherein the support structure includes a conductive portion,
- wherein the conductive portion of the support structure is in electrical contact with the inner third cylindrical conductive section,
- wherein an inner radius of the smallest of the first and the at least one second cylindrical conductive sections is larger than an outer radius of the third inner cylindrical conductive section electrically connected to the support structure,
- wherein the third inner cylindrical conductive section has a length along the conductor that is at least as long as the length of the first and the second cylindrical conductive sections, and
- wherein the third inner cylindrical conductive section comprises an equipotential cylinder that provides a reference potential (voltage) based on the electrical potential (voltage) of the conductor that passes through the interior of the cylindrical conductive sections, with respect to which differential voltages of the other cylindrical conductive sections are measured; and one or more transient voltage suppression devices; and
one or more antennas.

19. A system for monitoring overhead power lines, comprising
at least one apparatus of claim 18; and
at least one wireless interrogator configured to transmit radio frequency signals to activate at least one acoustic wave device,
wherein the at least one wireless interrogator is configured to receive data from the apparatus and interpret sensor responses to extract measurement information.

* * * * *